US012568622B2

(12) United States Patent
Zhu

(10) Patent No.: US 12,568,622 B2
(45) Date of Patent: Mar. 3, 2026

(54) MEMORY DEVICE AND METHOD OF MANUFACTURING THE SAME, AND ELECTRONIC APPARATUS INCLUDING MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 410 days.

(21) Appl. No.: 18/175,907

(22) Filed: Feb. 28, 2023

(65) Prior Publication Data

US 2024/0074191 A1 Feb. 29, 2024

(30) Foreign Application Priority Data

Aug. 26, 2022 (CN) ......................... 202211036649.X

(51) Int. Cl.
*H10B 43/27* (2023.01)
*H10B 51/20* (2023.01)
(Continued)

(52) U.S. Cl.
CPC ............. *H10B 43/27* (2023.02); *H10B 51/20* (2023.02); *H10D 30/63* (2025.01); *H10B 63/34* (2023.02);
(Continued)

(58) Field of Classification Search
CPC ............ H10B 63/34; H10B 63/84–845; H10B 20/00–10; H10B 20/27–50;
(Continued)

(56) References Cited

U.S. PATENT DOCUMENTS 9,373,540 B2 * 6/2016 Hyun ................ H01L 21/76838
9,425,209 B1 * 8/2016 Yang ...................... H10B 43/27
(Continued)

FOREIGN PATENT DOCUMENTS

CN 112909010 A 6/2021

OTHER PUBLICATIONS

First Office Action for Chinese Application No. CN202211036649.X, dated Jun. 29, 2025, 14 Pages.

*Primary Examiner* — Maliheh Malek
(74) *Attorney, Agent, or Firm* — Christopher R. Christenson; Kelly, Holt & Christenson, P.L.L.C.

(57) ABSTRACT

A memory device, a method of manufacturing the same, and an electronic apparatus including the same. The memory device includes: a plurality of cell active layers vertically stacked on a substrate, each cell active layer including a lower source/drain region and an upper source/drain region located at different vertical heights and a channel region between the lower source/drain region and the upper source/drain region; a gate stack on the substrate and extending vertically relative to the substrate to pass through the cell active layers, the gate stack including a gate conductor layer and a memory functional layer arranged between the gate conductor layer and the cell active layers, and a memory cell being defined at an intersection of the gate stack and each cell active layer; and a conductive metal layer arranged on a lower surface of each cell active layer and/or an upper surface of each cell active layer.

17 Claims, 16 Drawing Sheets

(51) Int. Cl.
| | | |
|---|---|---|
| *H10B 63/00* | (2023.01) | |
| *H10D 30/63* | (2025.01) | |
| *H10D 84/01* | (2025.01) | |

(52) U.S. Cl.
CPC ....... *H10D 84/016* (2025.01); *H10D 84/0195* (2025.01)

(58) Field of Classification Search
CPC ...... H10B 69/00; H10D 30/63; H10D 84/016; H10D 84/0195; H10D 30/0291–0297; H10D 30/66–669; H10D 30/6728; G11C 17/10–126; G11C 16/02; G11C 5/06–10
See application file for complete search history.

(56) References Cited

U.S. PATENT DOCUMENTS

| | | | | |
|---|---|---|---|---|
| 9,437,483 | B2 * | 9/2016 | Lee | H10B 43/50 |
| 9,601,577 | B1 * | 3/2017 | Lee | H10D 84/0144 |
| 9,728,549 | B2 * | 8/2017 | Yun | H10B 43/40 |
| 9,780,104 | B2 * | 10/2017 | Nomachi | H01L 23/528 |
| 9,824,966 | B1 * | 11/2017 | Kanakamedala | H01L 23/5226 |
| 9,831,260 | B2 * | 11/2017 | Zhang | H10B 43/35 |
| 9,853,051 | B1 * | 12/2017 | Lee | H10B 41/27 |
| 9,871,053 | B2 * | 1/2018 | Kwak | H10B 43/10 |
| 9,876,031 | B1 * | 1/2018 | Shimizu | H10B 43/27 |
| 9,953,992 | B1 * | 4/2018 | Ogawa | H10B 43/27 |
| 10,014,315 | B2 * | 7/2018 | Kim | H10D 1/042 |
| 10,074,667 | B1 * | 9/2018 | Higashi | H01L 25/0657 |
| 10,192,784 | B1 * | 1/2019 | Cui | H10B 43/50 |
| 10,199,326 | B1 * | 2/2019 | Ohsaki | H10B 43/20 |
| 10,283,493 | B1 * | 5/2019 | Nishida | H01L 24/80 |
| 10,332,900 | B2 * | 6/2019 | Yun | H10B 43/30 |
| 10,373,673 | B2 * | 8/2019 | Shin | G11C 11/06042 |
| 10,566,336 | B1 * | 2/2020 | Guo | H10B 43/35 |
| 10,580,795 | B1 * | 3/2020 | Luo | H10B 43/10 |
| 10,665,581 | B1 * | 5/2020 | Zhou | H10D 88/00 |
| 10,685,977 | B2 * | 6/2020 | Kim | H10B 43/10 |
| 10,707,121 | B2 * | 7/2020 | Liu | H10B 41/50 |
| 10,748,923 | B2 * | 8/2020 | Son | H10B 43/27 |
| 10,847,534 | B2 * | 11/2020 | Chu | H10B 43/27 |
| 10,854,627 | B1 * | 12/2020 | Moriyama | H10D 30/63 |
| 10,950,626 | B2 * | 3/2021 | Kai | H10B 43/35 |
| 10,984,866 | B2 * | 4/2021 | Oh | H10B 41/20 |
| 11,171,151 | B2 * | 11/2021 | Kang | H01L 21/76858 |
| 11,367,736 | B2 * | 6/2022 | Tokita | H10B 41/10 |
| 11,469,171 | B2 * | 10/2022 | Kim | H10B 43/40 |
| 11,729,985 | B2 * | 8/2023 | Shimizu | H10B 43/27 |
| 11,889,694 | B2 * | 1/2024 | Chibvongodze | G11C 8/14 |
| 11,955,470 | B2 * | 4/2024 | Kim | H10B 43/10 |
| 12,046,565 | B2 * | 7/2024 | Lee | H10B 43/40 |
| 12,075,624 | B2 * | 8/2024 | Baek | H10B 43/10 |
| 12,080,645 | B2 * | 9/2024 | Shin | H10B 43/10 |
| 12,327,757 | B2 * | 6/2025 | Shim | H10B 41/41 |
| 12,334,471 | B2 * | 6/2025 | Park | H10D 88/01 |
| 2012/0108048 | A1 * | 5/2012 | Lim | H10B 41/50 |
| | | | | 438/585 |
| 2016/0027796 | A1 * | 1/2016 | Yang | H10B 43/50 |
| | | | | 257/314 |
| 2016/0268290 | A1 * | 9/2016 | Matsunaga | H10B 43/50 |
| 2016/0293625 | A1 * | 10/2016 | Kang | H01L 23/528 |
| 2016/0365351 | A1 * | 12/2016 | Nishikawa | H10D 1/47 |
| 2016/0372322 | A1 * | 12/2016 | Oh | H10B 41/27 |
| 2017/0011996 | A1 * | 1/2017 | Lee | H01L 21/76877 |
| 2017/0098658 | A1 * | 4/2017 | Matsuda | H10B 41/10 |
| 2017/0103993 | A1 * | 4/2017 | Lee | H10B 43/35 |
| 2017/0103995 | A1 * | 4/2017 | Hatano | H10B 41/30 |
| 2017/0148804 | A1 * | 5/2017 | Lee | H10D 1/00 |
| 2017/0236746 | A1 * | 8/2017 | Yu | G11C 16/24 |
| | | | | 257/314 |
| 2017/0236896 | A1 * | 8/2017 | Lu | H10B 43/50 |
| | | | | 257/314 |
| 2017/0263556 | A1 * | 9/2017 | Tessariol | H10B 43/50 |
| 2017/0294383 | A1 * | 10/2017 | Tanzawa | H10B 43/27 |
| 2017/0317088 | A1 * | 11/2017 | Lee | H10B 43/27 |
| 2018/0166454 | A1 * | 6/2018 | Pyon | H10B 41/20 |
| 2018/0190540 | A1 * | 7/2018 | Liu | H01L 23/528 |
| 2018/0254284 | A1 * | 9/2018 | Hwang | G11C 16/10 |
| 2018/0277499 | A1 * | 9/2018 | Oshiki | H10B 43/10 |
| 2018/0350831 | A1 * | 12/2018 | Kim | G11C 11/4099 |
| 2018/0358371 | A1 * | 12/2018 | Hwang | H01L 25/0657 |
| 2019/0013326 | A1 * | 1/2019 | Hua | H10D 64/037 |
| 2019/0043836 | A1 * | 2/2019 | Fastow | H01L 25/0657 |
| 2019/0057898 | A1 * | 2/2019 | Shim | H10B 43/10 |
| 2019/0067314 | A1 * | 2/2019 | Lu | H01L 21/76895 |
| 2019/0088589 | A1 * | 3/2019 | Zhu | H10B 43/40 |
| 2019/0371728 | A1 * | 12/2019 | Gossman | H01L 21/76816 |
| 2020/0066703 | A1 * | 2/2020 | Kim | H10B 43/10 |
| 2020/0098748 | A1 * | 3/2020 | Xiao | G11C 5/06 |
| 2020/0105783 | A1 * | 4/2020 | Baek | H01L 21/76897 |
| 2020/0185408 | A1 * | 6/2020 | Song | H10B 43/10 |
| 2020/0194456 | A1 * | 6/2020 | Baek | H10B 43/40 |
| 2020/0350330 | A1 * | 11/2020 | Ahn | H10B 43/50 |
| 2020/0357784 | A1 * | 11/2020 | Park | H01L 24/08 |
| 2020/0365616 | A1 * | 11/2020 | Baek | H10B 43/40 |
| 2020/0402994 | A1 * | 12/2020 | Yang | H10B 43/35 |
| 2021/0050360 | A1 * | 2/2021 | Kai | G11C 5/063 |
| 2021/0066282 | A1 * | 3/2021 | Kim | H10D 88/00 |
| 2021/0125928 | A1 * | 4/2021 | Kim | H01L 23/535 |
| 2021/0210428 | A1 * | 7/2021 | Ohsawa | H10B 43/10 |
| 2021/0210498 | A1 * | 7/2021 | Leobandung | G11C 16/24 |
| 2021/0217760 | A1 * | 7/2021 | Yang | H10B 43/27 |
| 2021/0242241 | A1 * | 8/2021 | Rajashekhar | H10B 41/10 |
| 2021/0296324 | A1 * | 9/2021 | Lim | H01L 21/31116 |
| 2022/0028876 | A1 * | 1/2022 | Purayath | H10B 43/50 |
| 2022/0028886 | A1 * | 1/2022 | Purayath | H10B 43/27 |
| 2022/0115294 | A1 * | 4/2022 | Kim | H01L 24/08 |
| 2022/0122933 | A1 * | 4/2022 | Hwang | H01L 25/50 |
| 2022/0130782 | A1 * | 4/2022 | Ahn | H01L 24/80 |
| 2022/0262815 | A1 * | 8/2022 | Yada | H10B 41/27 |
| 2022/0271053 | A1 * | 8/2022 | Ohya | H10B 43/50 |
| 2022/0336486 | A1 * | 10/2022 | Kitazawa | H10B 63/34 |
| 2023/0309305 | A1 * | 9/2023 | Choi | H10B 43/10 |
| 2023/0369208 | A1 * | 11/2023 | Sharangpani | H01L 23/535 |
| 2023/0403853 | A1 * | 12/2023 | Zhu | H10D 62/151 |
| 2024/0099027 | A1 * | 3/2024 | Takahashi | H10B 63/30 |
| 2024/0130122 | A1 * | 4/2024 | Lee | H10B 43/50 |
| 2024/0237345 | A1 * | 7/2024 | Iwata | H10B 41/10 |
| 2024/0373632 | A1 * | 11/2024 | Kim | H01L 23/5223 |
| 2024/0387667 | A1 * | 11/2024 | Chang | H10D 30/6892 |
| 2025/0126794 | A1 * | 4/2025 | Or-Bach | G11C 11/5621 |
| 2025/0218470 | A1 * | 7/2025 | Lee | H10B 43/27 |
| 2025/0240979 | A1 * | 7/2025 | Kanamori | H01L 25/50 |
| 2025/0266358 | A1 * | 8/2025 | Irimoto | H10B 43/10 |

* cited by examiner

Cell region ⟷ Contact region 1021
1019

1001

$1023_5$ $1023_4$ $1023_3$ $1023_2$ $1023_1$

1001

MEMORY DEVICE AND METHOD OF MANUFACTURING THE SAME, AND ELECTRONIC APPARATUS INCLUDING MEMORY DEVICE

This application claims priority to Chinese Patent Application No. 202211036649.X, filed on Aug. 26, 2022, the entire content of which is incorporated herein in its entirety by reference.

TECHNICAL FIELD

The present disclosure relates to a field of a semiconductor technology, and in particular, to a memory device, a method of manufacturing the memory device, and an electronic apparatus including the memory device.

BACKGROUND

In a horizontal device such as a Metal Oxide Semiconductor Field Effect Transistor (MOSFET), a source, a gate and a drain are arranged in a direction substantially parallel to a surface of a substrate. Due to this arrangement, the horizontal device is not easy to be further scaled down. In contrast, in a vertical device, the source, the gate and the drain are arranged in a direction substantially perpendicular to the surface of the substrate. Therefore, the vertical device may be easier to be scaled down than the horizontal device. Moreover, vertical devices are easy to be stacked on each other, so that they may be adapted to obtain a three-dimensional (3D) structure.

However, it is difficult to embed a metal conductive line in the 3D structure, especially when a channel is made of a single crystal silicon material to suppress an increase of a resistance.

SUMMARY

In view of this, an object of the present disclosure is at least in part to provide a memory device with an improved performance, a method of manufacturing the memory device, and an electronic apparatus including the memory device.

According to an aspect of the present disclosure, a memory device is provided, including: a plurality of cell active layers vertically stacked on a substrate, where each cell active layer includes a lower source/drain region and an upper source/drain region located at different vertical heights in the cell active layer, and a channel region between the lower source/drain region and the upper source/drain region; a gate stack on the substrate and extending vertically relative to the substrate to pass through the plurality of cell active layers, where the gate stack includes a gate conductor layer and a memory functional layer arranged between the gate conductor layer and the cell active layers, and a memory cell is defined at an intersection of the gate stack and each cell active layer; and a conductive metal layer arranged on at least one of a lower surface of each cell active layer and an upper surface of each cell active layer.

According to another aspect of the present disclosure, a method of manufacturing a memory device is provided, including: providing a stack of a plurality of cell active layers and a plurality of sacrificial layers on a substrate, where each cell active layer is provided with a sacrificial layer on at least one side of the cell active layer; forming a processing channel extending vertically relative to the substrate to pass through the stack; removing the sacrificial layers through the processing channel; forming, in a space released due to a removal of the sacrificial layers, a conductive metal layer on a lower surface of each exposed cell active layer and/or an upper surface of each exposed cell active layer through the processing channel, and forming an isolation layer electrically isolating conductive metal layers from each other; and forming a gate stack in the processing channel, where the gate stack includes a gate conductor layer and a memory functional layer arranged between the gate conductor layer and the cell active layers, and a memory cell is defined at an intersection of the gate stack and the cell active layer.

According to another aspect of the present disclosure, an electronic apparatus is provided, including the memory device as described above.

According to embodiments of the present disclosure, a conductive metal layer may be provided as a bit line/source line connection to reduce a resistance. In addition, a three-dimensional (3D) memory device may be built by using a stack of a single crystal material as a building module. Therefore, an increase of the resistance may be suppressed when a plurality of memory cells are stacked on each other.

BRIEF DESCRIPTION OF THE DRAWINGS

The above and other objectives, features, and advantages of the present disclosure will be clearer through the following descriptions of embodiments of the present disclosure with reference to accompanying drawings, in which:

FIG. 1 to FIG. 13(c) show schematic diagrams of some stages in a process of manufacturing a memory device according to an embodiment of the present disclosure;

FIG. 10(c), FIG. 11(b), FIG. 12(b) and FIG. 13(c) are cross-sectional views taken along line BB'.

Throughout the accompanying drawings, the same or similar reference numerals indicate the same or similar components.

DETAILED DESCRIPTION OF EMBODIMENTS

Figure 1:
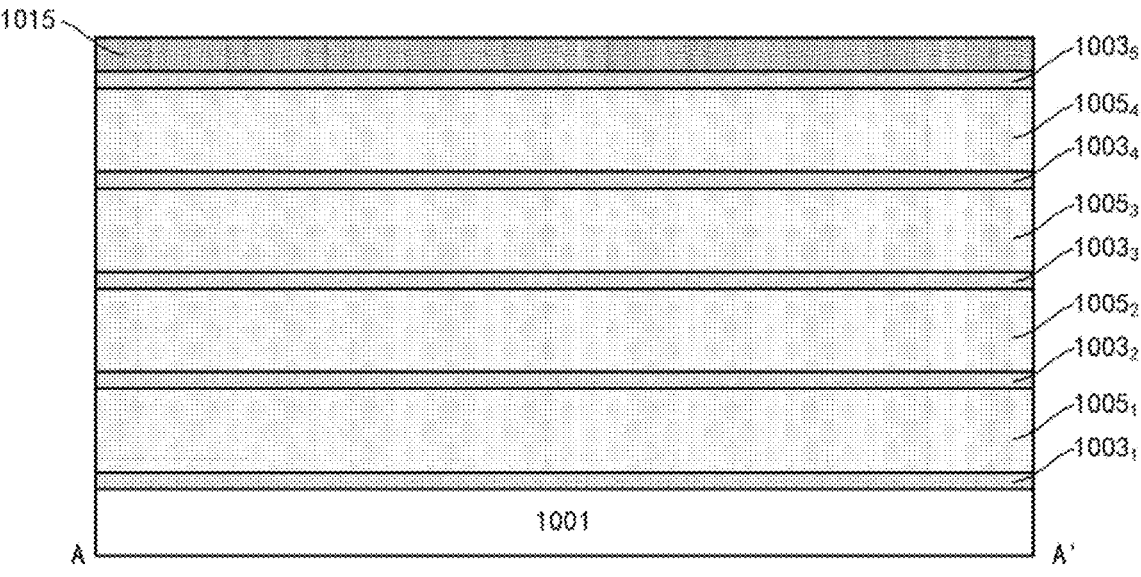

Embodiments of the present disclosure will be described below with reference to accompanying drawings. However, it should be understood that these descriptions are only exemplary, and are not intended to limit the scope of the present disclosure. Moreover, in the following descriptions, descriptions of well-known structures and technologies are omitted to avoid unnecessarily obscuring the concept of the present disclosure.

Various schematic structural diagrams according to embodiments of the present disclosure are shown in the accompanying drawings. The drawings are not drawn to scale. Some details are enlarged and some details may be omitted for clarity of presentation. Shapes of the various regions, layers and a relative size and a positional relationship thereof shown in the drawings are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being "on" another layer/element, the layer/element may be directly on the another layer/element, or there may be an intermediate layer/element therebetween. In addition, if a layer/element is "on" another layer/element in an orientation, the layer/element may be "under" the another layer/element when the orientation is reversed.

A memory device according to embodiments of the present disclosure is based on a vertical device. The vertical device may include an active region provided on a substrate in a vertical direction (which is substantially perpendicular to a direction of a surface of a substrate), and the active region includes source/drain regions located at different vertical heights (e.g., at upper and lower ends, respectively) and a channel region between the source/drain regions. A conductive channel may be formed between the source/drain regions through the channel region. In the active region, the source/drain regions and the channel region may be defined by a doping concentration, for example.

According to embodiments of the present disclosure, the active region may be defined by a cell active layer on the substrate. For example, the cell active layer may be a semiconductor material layer, the source/drain regions may be respectively formed at opposite ends of the semiconductor material layer in the vertical direction by doping (e.g., diffusion doping described below), and the channel region may be formed in the middle of the semiconductor material layer in the vertical direction. Alternatively, the cell active layer may be a stack of a source/drain layer, a channel layer, and a source/drain layer, where the source/drain layer may be doped in situ during a growth to form the source/drain region therein. A gate stack may extend through the cell active layer, so that the active region may surround a periphery of the gate stack. Here, the gate stack may include at least one memory functional layer selected from a charge trapping material, a ferroelectric material, or the like, in order to achieve a memory function. The gate stack cooperates with the active region corresponding to the gate stack to define a memory cell. Here, the memory cell may be a flash cell.

A plurality of gate stacks may be provided to pass through the cell active layer, so as to define a plurality of memory cells at intersections of the plurality of gate stacks and the cell active layer. The memory cells are arranged into an array (e.g., a two-dimensional array arranged in rows and columns generally) corresponding to the plurality of gate stacks in a plane where the cell active layer is located.

Due to a characteristic that the vertical devices are easy to be stacked on each other, the memory device according to embodiments of the present disclosure may be a three-dimensional (3D) array. Specifically, a plurality of cell active layers may be provided in the vertical direction. The gate stack may extend vertically to pass through the plurality of cell active layers. In this way, a single gate stack intersects the plurality of cell active layers stacked in the vertical direction to define a plurality of memory cells stacked in the vertical direction.

In a NOR-type memory device, each memory cell may be connected to a common source line. In view of this configuration, in order to save an amount of wiring, two adjacent memory cells in the vertical direction may share a same source line connection. For example, for the two adjacent memory cells, a source/drain region of each of the two adjacent memory cells at a near end (that is, an end where the two memory cells are close to each other) may be used as a source region and may thus be electrically connected to a source line through a common contact portion, for example; respective source/drain regions of the two adjacent memory cells at respective remote ends (i.e., ends of the two memory cells away from each other) may be used as drain regions and may thus be connected to different bit lines, respectively.

The cell active layer may be formed by an epitaxial growth and may include a single crystal semiconductor material. Different from a conventional process of forming a plurality of gate stacks stacked on each other and then forming a vertical active region passing through the gate stacks, a single crystal active region (especially a channel region) may be formed more easily.

The cell active layer may be doped in situ during a growth, and may define doping characteristics in the channel region. In addition, a doping of the source/drain region may be formed by diffusion. For example, solid phase dopant source layers may be provided at opposite ends of each cell active layer, and dopants in the solid phase dopant source layers may be driven into the cell active layer to form the source/drain regions. Therefore, a doping distribution of the source/drain region and a doping distribution of the channel region may be adjusted separately, and a steep high source/drain doping may be formed.

A conductive metal layer may be provided on at least one of a lower surface of the cell active layer and an upper surface of the cell active layer, which may facilitate a reduction of a resistance. Each of the lower surface of the cell active layer and the upper surface of the cell active layer is provided with the conductive metal layer, one of the conductive metal layers may be used as a bit line (BL) connection, and the other of the conductive metal layers may be used as a source line (SL) connection. Alternatively, one of the lower surface of the cell active layer and the upper surface of the cell active layer is provided with the conductive metal layer (while the other surface is not provided with the conductive metal layer), the conductive metal layer may be used as the BL connection or the SL connection.

In an example, the vertical memory device may be manufactured as follows. Specifically, a stack of a plurality of cell active layers and a plurality of sacrificial layers may be provided on the substrate, so that each cell active layer is provided with a sacrificial layer on at least one side (an upper side and/or a lower side) of the cell active layer. For example, the cell active layer and the sacrificial layer may be arranged alternately, or a sacrificial layer may be provided at an interval of every two cell active layers. The cell active layer and the sacrificial layer may be provided by an epitaxial growth. The sacrificial layer may subsequently be replaced with an isolation layer (in particular, a structure in which the isolation layer is between the conductive metal layers). In addition, during the epitaxial growth, an in situ doping may be performed to achieve a desired doping polarity and a desired doping concentration.

A processing channel extending vertically relative to the substrate to pass through each cell active layer may be formed. A sidewall of the sacrificial layer may be exposed in the processing channel, so that the sacrificial layer may be replaced with the structure in which the isolation layer is between the conductive metal layers. For example, a supporting layer may be formed in at least one processing channel, so that the stack may be supported when replacing the sacrificial layer. The sacrificial layer may be removed through a remaining processing channel by, for example, a selective etching. In a space released due to a removal of the sacrificial layer, the conductive metal layer and the isolation layer may be formed by deposition and then etching back.

According to other embodiments, the sacrificial layer may be replaced with the solid phase dopant source layer. Dopants may be driven from solid phase dopant source layers into opposite ends of the cell active layer by annealing, so as to form the source/drain regions. After that, the solid phase dopant source layer may be replaced with the structure in which the isolation layer is between the conductive metal layers. In addition, the gate stack may be formed in the processing channel.

The present disclosure may be presented in various forms, some examples of which will be described below. In the following descriptions, a selection of various materials is involved. In the selection of the material, in addition to a function of the material (for example, a semiconductor material may be used for forming an active region, a dielectric material may be used for forming an electrical isolation, and a conductive material may be used for forming an electrode, an interconnect structure, etc.), an etching selectivity is considered. In the following descriptions, a required etching selectivity may or may not be indicated. It should be clear to those skilled in the art that when etching a material layer is mentioned below, if it is not mentioned or shown that another layer is also etched, then the etching may be selective, and the material layer may have an etching selectivity relative to the another layer exposed to the same etching formula.

FIG. 1 to FIG. 13(c) show schematic diagrams of some stages in a process of manufacturing a memory device according to an embodiment of the present disclosure.

As shown in FIG. 1, a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following descriptions, for ease of explanation, a bulk Si substrate such as a Si wafer is taken as an example for description.

A memory device, such as a NOR-type or AND-type flash memory, may be formed on the substrate 1001 as described below. A memory cell in the memory device may be an n-type device or a p-type device. Here, an n-type memory cell is taken as an example for description. A p-type well may be formed in the substrate 1001. Therefore, the following description, especially the description of a doping type, is directed to a formation of the n-type device. However, the present disclosure is not limited to this.

A sacrificial layer $1003_1$ used to define an isolation layer and a cell active layer $1005_1$ used to define an active region of the memory cell may be formed on the substrate 1001 by, for example, an epitaxial growth.

Each layer grown on the substrate 1001 may be a single crystal semiconductor layer. As the layers are grown or doped respectively, the layers may have a crystal interface or a doping concentration interface therebetween.

The sacrificial layer $1003_1$ may be subsequently replaced with an isolation layer for an electrical isolation, and a thickness of the sacrificial layer $1003_1$ may correspond to a thickness of a desired isolation layer, for example, in a range of about 10 nm to 50 nm. According to embodiments of the present disclosure, the sacrificial layer $1003_1$ may also be used to define a location of a bit line/source line (BL/SL) connection. The cell active layer $1005_1$ subsequently defines the active region of the memory cell, with a thickness in a range of about 40 nm to 200 nm, for example.

The semiconductor layers may include various suitable semiconductor materials, such as an element semiconductor material such as Si or Ge, a compound semiconductor material such as SiGe, etc. In consideration of a following process of replacing the sacrificial layer $1003_1$ with the isolation layer, the sacrificial layer $1003_1$ may have an etching selectivity relative to the cell active layer $1005_1$. For example, the sacrificial layer $1003_1$ may include SiGe (an atomic percentage of Ge is, for example, in a range of about 15% to 30%), and the cell active layer $1005_1$ may include Si.

When growing the cell active layer $1005_1$, the cell active layer $1005_1$ may be doped in situ. For example, for an n-type device, a p-type doping may be performed, and a doping concentration is in a range of about 1E17 $cm^{-3}$ to 1E19 $cm^{-3}$. The doping may define doping characteristics in a channel region subsequently formed, so as to adjust a device threshold voltage (V t), control a short channel effect, etc. Here, the doping concentration may have a non-uniform distribution in the vertical direction to optimize a device performance. For example, a concentration is relatively high in a region close to a drain region (which is subsequently connected to a bit line) to reduce the short channel effect, and a concentration is relatively low in a region close to a source region (which is subsequently connected to a source line) to reduce a channel resistance, which may be achieved by introducing different doses of dopants at different stages of growth.

In order to increase an integration density, a plurality of cell active layers may be provided. For example, cell active layers $1005_2$, $1005_3$, $1005_4$ may be provided on the cell active layer $1005_1$ through an epitaxial growth. The cell active layers are spaced apart from each other through sacrificial layers $1003_2$, $1003_3$ and $1003_4$ used to define the isolation layers. Although FIG. 1 shows only four cell active layers, the present disclosure is not limited to this. The cell active layers $1005_2$, $1005_3$, $1005_4$ may have the same or similar thickness and/or material as that of the cell active layer $1005_1$, and may also have a different thickness and/or material. Here, for convenience of description, it is assumed that the cell active layers have a same configuration.

A hard mask layer 1015 may be provided on the layers formed on the substrate 1001, so as to facilitate patterning. For example, the hard mask layer 1015 may include nitride (e.g., silicon nitride) with a thickness in a range of about 50 nm to 200 nm.

A sacrificial layer $1003_5$ used to define the isolation layer may be provided between the hard mask layer 1015 and the cell active layer $1005_4$. For the sacrificial layer $1003_2$ to $1003_5$, please refer to the above-mentioned descriptions of the sacrificial layer $1003_1$.

In the following, on the one hand, a processing channel may be required so that the sacrificial layer may be reached to replace the sacrificial layer with the isolation layer; on the other hand, it is required to define a region where a gate is formed. According to embodiments of the present disclosure, the above two may be performed in combination. Specifically, a gate region may be defined by using the processing channel.

Figure 2A:
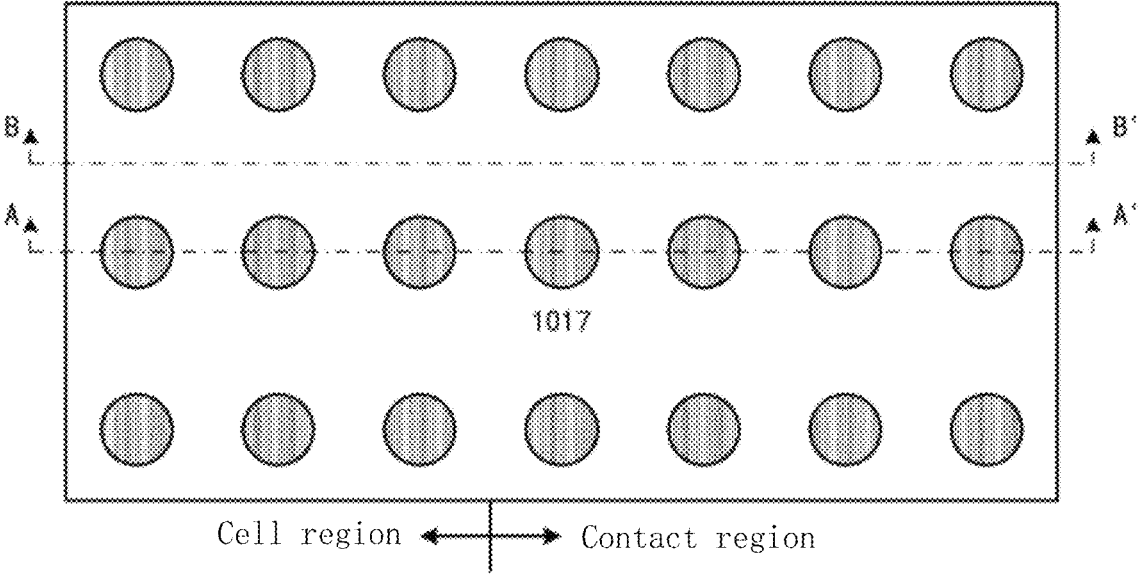
FIG. 2(a), FIG. 10(a) and FIG. 13(a) are top views, and positions of lines AA' and BB' are shown in FIG. 2(a), FIG. 1, FIG. 2(b), FIG. 3 to FIG. 9, FIG. 10(b), FIG. 11(a), FIG. 12(a), FIG. 13(b), FIG. 15 to FIG. 21 are cross-sectional views taken along line AA'.
Figure 2B:
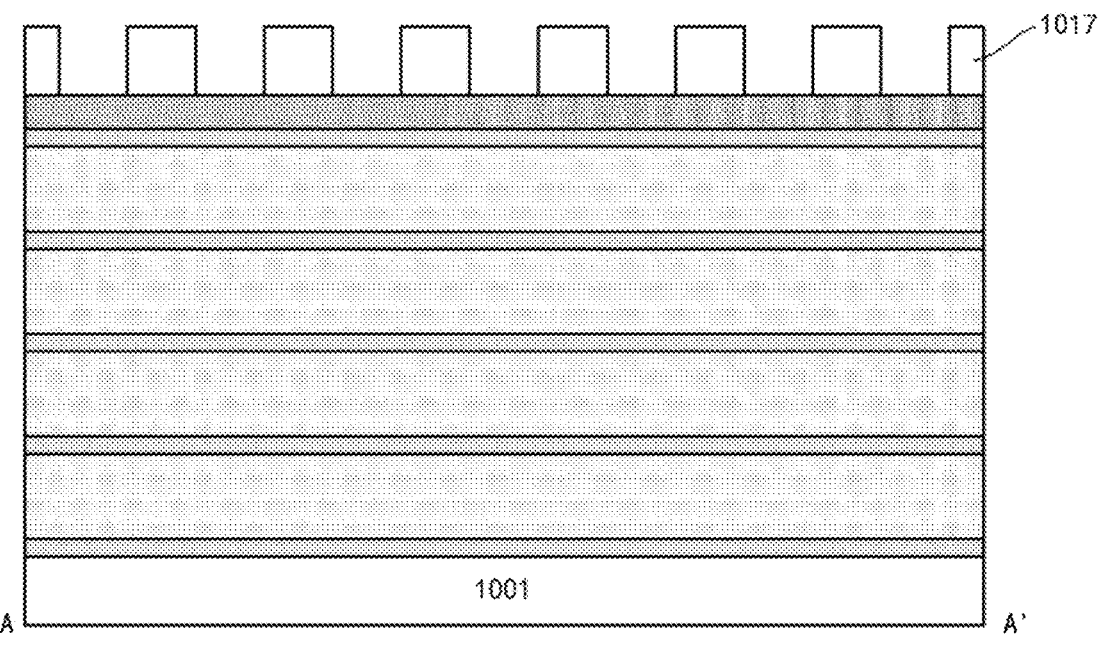

For example, as shown in FIG. 2(a) and FIG. 2(b), a photoresist 1017 may be formed on the hard mask layer 1015, and the photoresist 1017 may be patterned into a series of openings by photolithography. The openings may define positions of the processing channels. The openings may have various suitable shapes, such as a circular, a rectangular, a square, a polygonal, etc., and may have a suitable size, such as a diameter or side length in a range of about 20 nm to 500 nm. Here, the openings (especially in a cell region) may be arranged into an array, such as a two-dimensional array in a horizontal direction and a vertical direction on a paper surface in FIG. 2(a). The array may subsequently define an array of memory cells. Although FIG. 2(a) shows that the openings are formed on the substrate (including a cell region where the memory cell is to be made subsequently and a contact region where a contact portion is to be made subsequently) with a substantially uniform size and a substantially uniform density. However, the present disclosure is not limited to this. The size and/or the density of the openings may be varied, for example, a density of openings in the contact region may be less than a density of the openings in the cell region, so as to reduce a resistance in the contact region.

Figure 3:
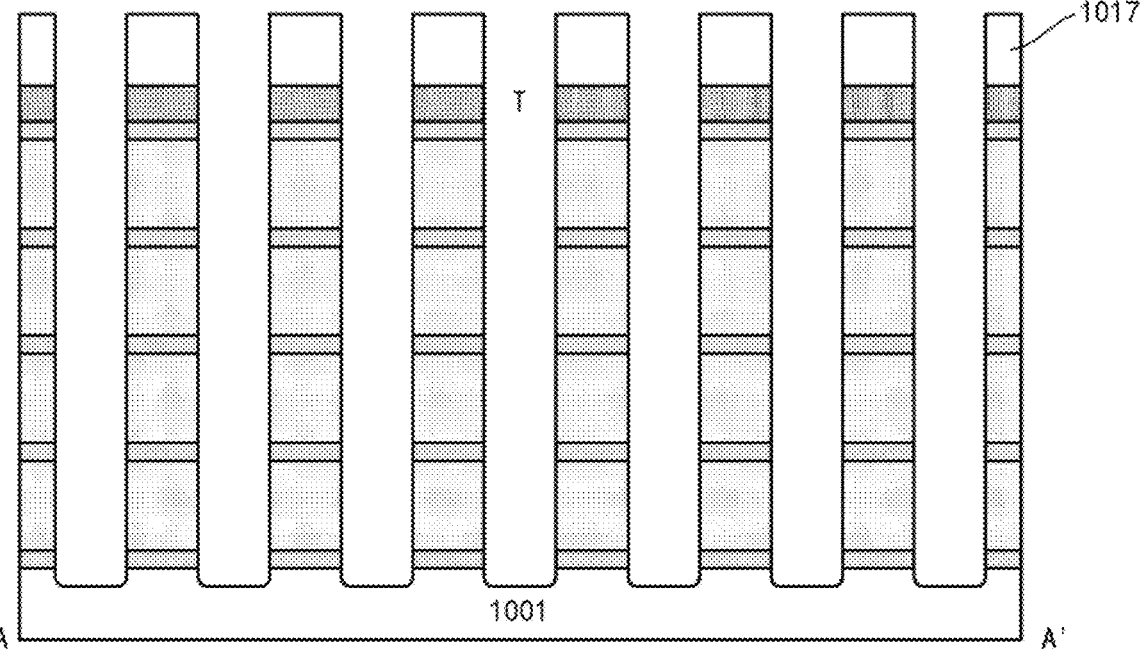

As shown in FIG. 3, each layer on the substrate 1001 may be etched by an anisotropic etching such as Reactive Ion Etching (RIE) by using the photoresist 1017 thus patterned as an etching mask, so as to form a processing channel T. The RIE may be performed in a substantially vertical direction (e.g., a direction perpendicular to a surface of the substrate) and may be performed into the substrate 1001. Therefore, a series of vertical processing channels T are provided on the substrate 1001. The processing channel T in the cell region also defines the gate region. After that, the photoresist 1017 may be removed.

A sidewall of the sacrificial layer is exposed in the processing channel T. Therefore, the sacrificial layer may be replaced with the isolation layer through the exposed sidewall. In consideration of a function for supporting the cell active layers $1005_1$ to $1005_4$ during the replacement, a supporting layer may be formed.

Figure 4:
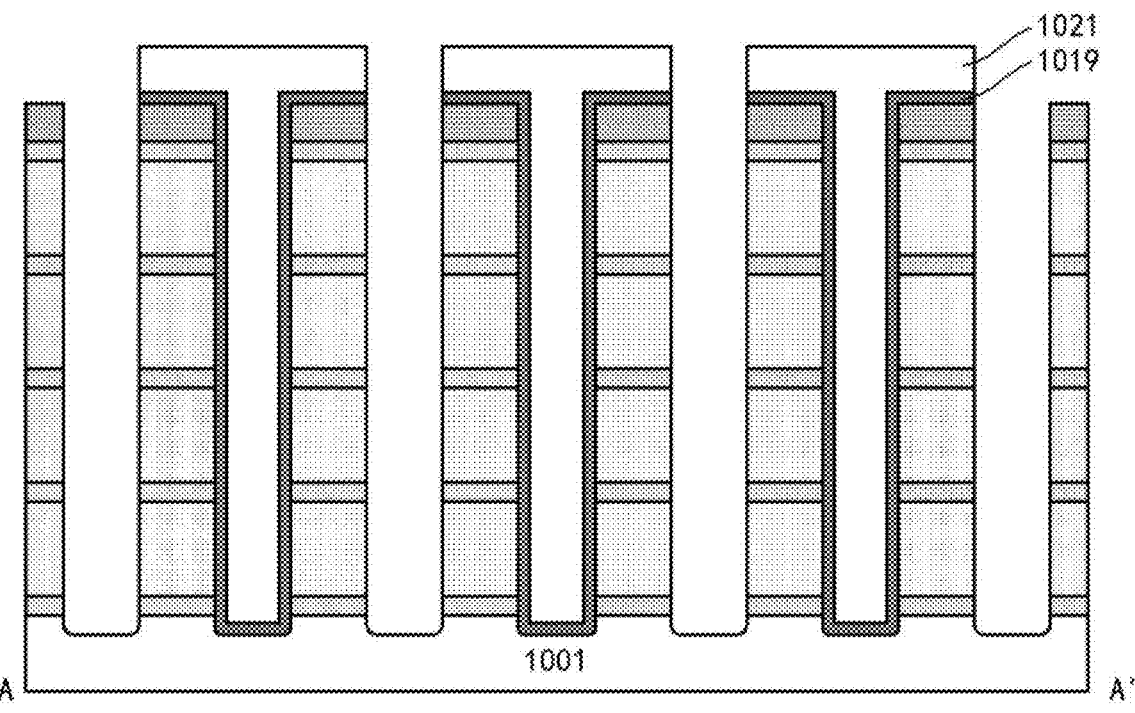

For example, as shown in FIG. 4, a supporting material layer may be formed on the substrate 1001 by, for example, deposition such as Chemical Vapor Deposition (CVD). The supporting material layer may be formed in a substantially conformal manner. In consideration of the etching selectivity, the supporting material layer may include, for example, SiC, in particular, relative to the hard mask layer 1015 (nitride in the example) and a subsequently formed isolation layer (oxide in the example). For example, by forming a photoresist 1021 and cooperating with the photoresist 1021 for a selective etching such as RIE, the supporting material layer in at least one processing channel T may be removed, while the supporting material layer in a remaining processing channel T may be retained. The retained supporting material layer forms a supporting layer 1019. In this way, on the one hand, the sacrificial layer may be replaced through the processing channel in which no supporting layer 1019 is formed, and on the other hand, the cell active layers $1005_1$ to $1005_4$ may be supported by the supporting layer 1019 in other processing channels. After that, the photoresist 1021 may be removed.

An arrangement of the processing channel in which the supporting layer 1019 is formed and the processing channel in which no supporting layer 1019 is formed may be implemented through a patterning of the photoresist 1021, and the processing channels may be substantially uniformly distributed for a consistency and a uniformity of the process. As shown in FIG. 4, the processing channel in which the supporting layer 1019 is formed and the processing channel in which no supporting layer 1019 is formed may be alternately arranged.

According to embodiments of the present disclosure, a source/drain doping may be performed by using a diffusion doping, so as to achieve a better doping characteristic. Therefore, before forming the isolation layer, the sacrificial layer may be replaced with the solid phase dopant source layer.

Figure 5:
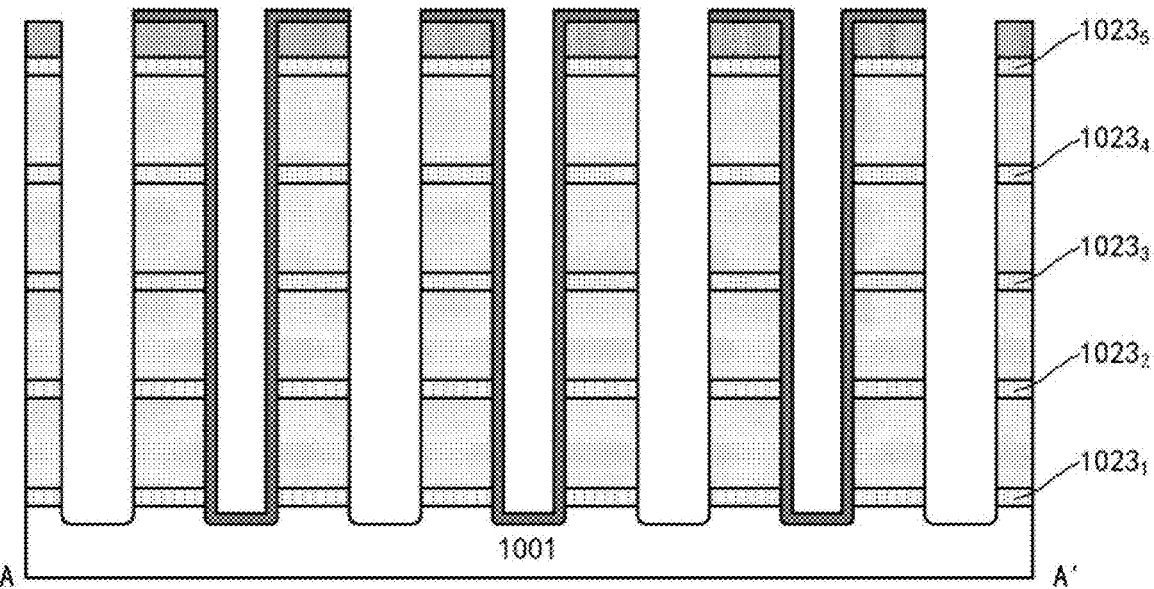

For example, as shown in FIG. 5, the sacrificial layers $1003_1$ to $1003_5$ may be removed by a selective etching through the processing channel T. Due to an existence of the supporting layer 1019, the cell active layers $1005_1$ to $1005_4$ may be kept from collapsing. A dopant-containing material may be filled in a gap left by a removal of the sacrificial layers, so as to form solid phase dopant source layers $1023_1$, $1023_2$, $1023_3$, $1023_4$ and $1023_5$ through a process such as deposition (preferably an Atomic Layer Deposition (ALD) to better control a film thickness) and then etching back (e.g., RIE in the vertical direction). For example, the solid phase dopant source layers $1023_1$ to $1023_5$ may include a phosphorosilicate glass (PSG) with a phosphorus (P) content in a range of about 0.1% to 10% (for an n-type memory cell), or a borosilicate glass (BSG) with a boron (B) content in a range of about 0.1% to 10% (for a p-type memory cell).

In the example, the source/drain doping may be implemented by the solid phase dopant source layer instead of in situ doping, which may achieve a steep high source/drain doping and may suppress a cross contamination that may be caused by in situ growth during the epitaxial growth.

Figure 6:
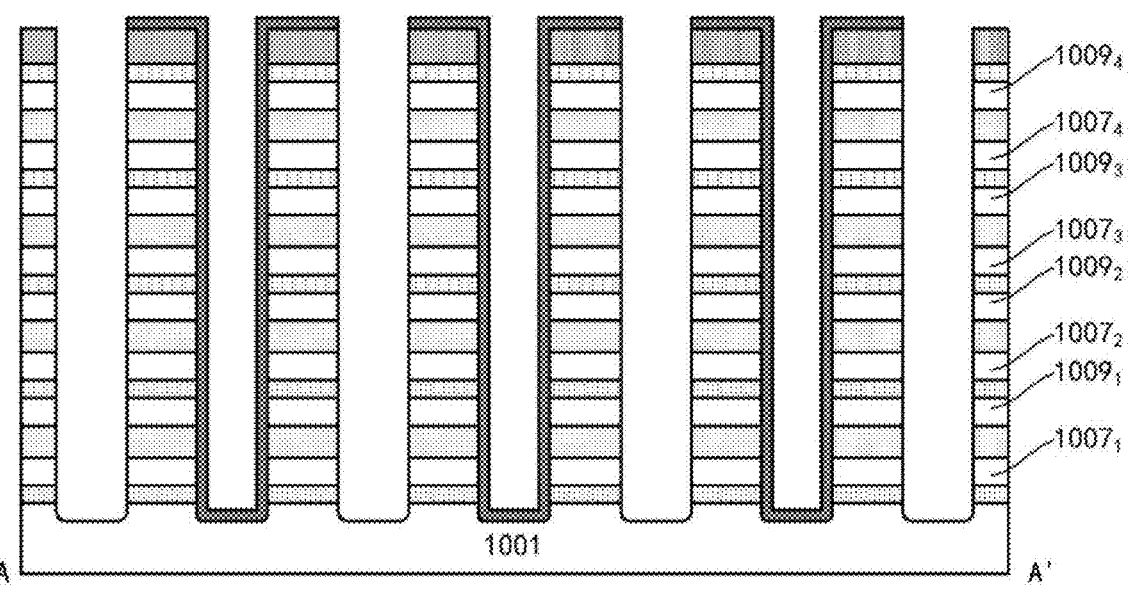

The dopants in the solid phase dopant source layer may be driven into the cell active layer by performing an annealing process. As shown in FIG. 6, the dopants in the solid phase dopant source layers at upper and lower ends of each of the cell active layers $1005_1$ to $1005_4$ enter each of the cell active layers $1005_1$ to $1005_4$ from the upper and lower ends respectively, so that high doping regions $1007_1$, $1009_1$; $1007_2$, $1009_2$; $1007_3$, $1009_3$; $1007_4$, $1009_4$ (e.g., an n-type doping of about 1E19 cm$^{-3}$ to 1E21 cm$^{-3}$) may be formed at the upper and lower ends of each of the cell active layers $1005_1$ to $1005_4$, so as to define source/drain regions. Here, a diffusion depth (e.g., in a range of about 10 nm to 50 nm) of the dopants from the solid phase dopant source layer to the cell active layer may be controlled, so that a middle portion of each cell active layer in the vertical direction may maintain a relatively low doping, for example, a doping polarity (e.g., a p-type doping) and a doping concentration (e.g., in a range of 1E17 cm$^{-3}$ to 1E19 cm$^{-3}$) caused by in situ doping during the growth may be substantially maintained, and the channel region may be defined.

The doping concentration achieved by the in situ doping is generally less than 1E20 cm$^{-3}$. According to embodiments of the present disclosure, the source/drain doping may be performed by a diffusion from the solid phase dopant source layer, which may achieve a high doping. For example, a maximum doping concentration may be greater than 1E20 cm$^{-3}$, or even up to about 7E20 cm$^{-3}$ to 3E21 cm$^{-3}$. In addition, due to a diffusion characteristic, the source/drain region may have a doping concentration gradient that decreases in the vertical direction from a side close to the solid phase dopant source layer to a side close to the channel region.

The diffusion doping may achieve a steep doping concentration distribution. For example, a steep abrupt change of a doping concentration may exist between the source/drain region and the channel region, such as less than about 5 nm/dec to 20 nm/dec (that is, a decrease of at least one order of magnitude in the doping concentration occurs in a range of less than about 5 nm to 20 mm). The abrupt change zone in the vertical direction may be referred to as an "interface layer".

Due to a diffusion from each solid phase dopant source layer to the cell active layer with approximately the same diffusion characteristic, the source/drain regions $1007_1$, $1009_1$; $1007_2$, $1009_2$; $1007_3$, $1009_3$; $1007_4$, $1009_4$ may be substantially coplanar laterally. Similarly, the channel regions may be substantially coplanar laterally. In addition, as described above, the channel region may have a non-uniform distribution in the vertical direction, and a doping concentration on a side of the channel region close to the source/drain region (drain region) is relatively high, while a doping concentration on another side of the channel region close to the source/drain region (source region) is relatively low.

Although it is advantageous to use the solid phase dopant source layer, the present disclosure is not limited to this. For example, the doping of the source/drain region may also be implemented by in situ doping during the epitaxial growth.

Figure 7:
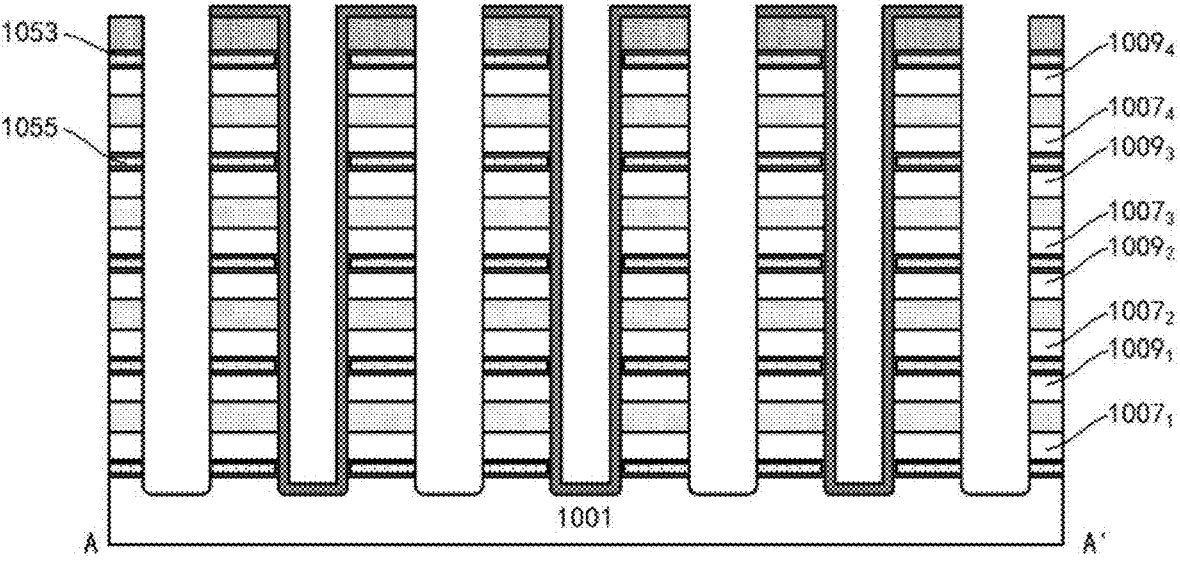

As shown in FIG. 7, the solid phase dopant source layers $1023_1$, $1023_2$, $1023_3$, $1023_4$ and $1023_5$ may be removed by the selective etching. A conductive metal layer 1053 and an isolation layer 1055 may be formed in a space released due to a removal of the solid phase dopant source layers $1023_1$, $1023_2$, $1023_3$, $1023_4$ and $1023_5$. For example, a conductive metal material such as tungsten (W), etc., may be deposited in a substantially conformal manner, and then a dielectric material such as an oxide may be deposited, so as to fill the released space and a remaining gap in the processing channel. Before depositing the conductive metal material, a conductive diffusion barrier layer may be formed. The deposited dielectric material and the deposited conductive metal material (and the diffusion barrier layer, if existing) may be etched back, such as RIE in the vertical direction, so as to be removed from the processing channel (the released processing channel will be used for a gate stack), and left in the space released due to the removal of the solid phase dopant source layers $1023_1$, $1023_2$, $1023_3$, $1023_4$ and $1023_5$, so that the conductive metal layer 1053 and the isolation layer 1055 may be obtained.

The conductive metal layer 1053 may extend on upper and lower surfaces of each cell active layer. A portion of the conductive metal layer 1053 extending on the upper and lower surfaces of each cell active layer may subsequently be used as a BL/SL connection of a memory cell in the corresponding cell active layer. In addition, due to the existence of the supporting layer 1019, the conductive metal layer 1053 has a portion (hereinafter referred to as a "sidewall portion", for the sake of convenience) extending along a sidewall of the isolation layer 1055 at a location where the conductive metal layer 1053 is adjacent to the supporting layer 1019, which may lead to an electrical connection between BL/SL connections of different cell active layers. This may be undesirable.

Figure 8:
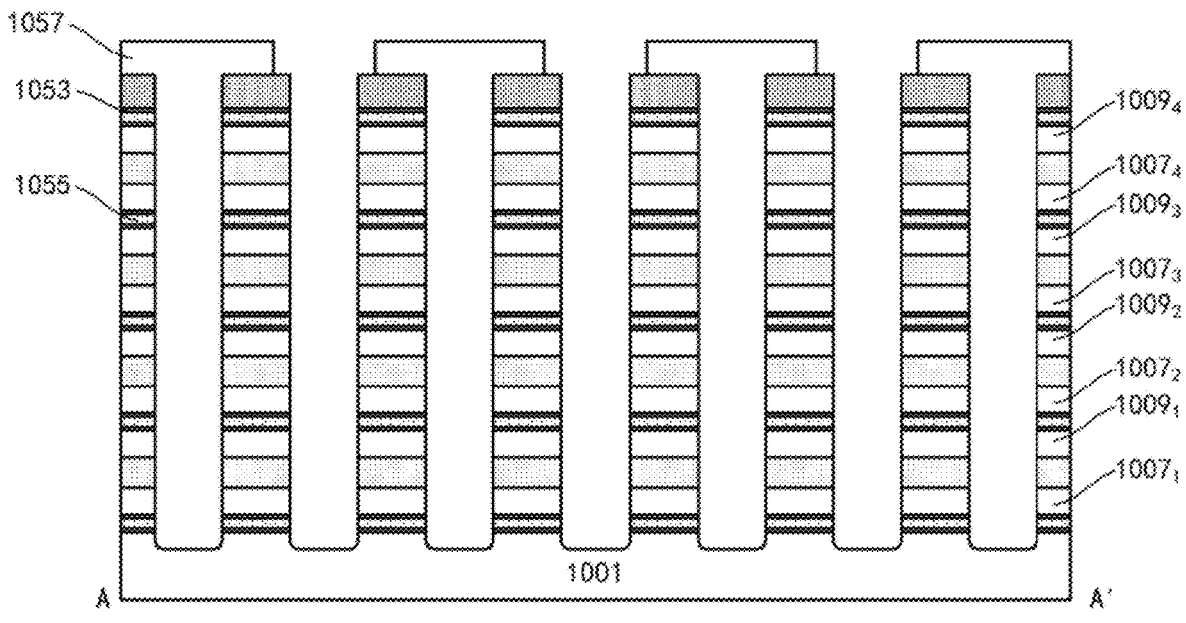

As shown in FIG. 8, the supporting layer 1019 may be removed by the selective etching. A masking layer 1057, such as a photoresist, may be formed in the processing channel in which no supporting layer 1019 has previously been formed, and the processing channel in which the supporting layer 1019 has previously been formed may be exposed, so that the sidewall portion of the conductive metal layer 1053 may be exposed in the processing channel. A sidewall portion of the conductive metal layer 1053 may be selectively etched through the processing channel that is not masked. Therefore, the conductive metal layer 1053 may be left on the upper and lower surfaces of each cell active layer to be used as the BL/SL connection of the corresponding cell active layer, and BL/SL connections of different cell active layers may be electrically isolated from each other.

After that, the masking layer 1057 may be removed.

A gate stack may be formed in the processing channel, especially in the processing channel in the cell region. Here, in order to form the memory device, the memory function may be implemented through the gate stack. For example, the gate stack may include a memory structure, such as a charge trapping material or a ferroelectric material, etc.

Figure 9:
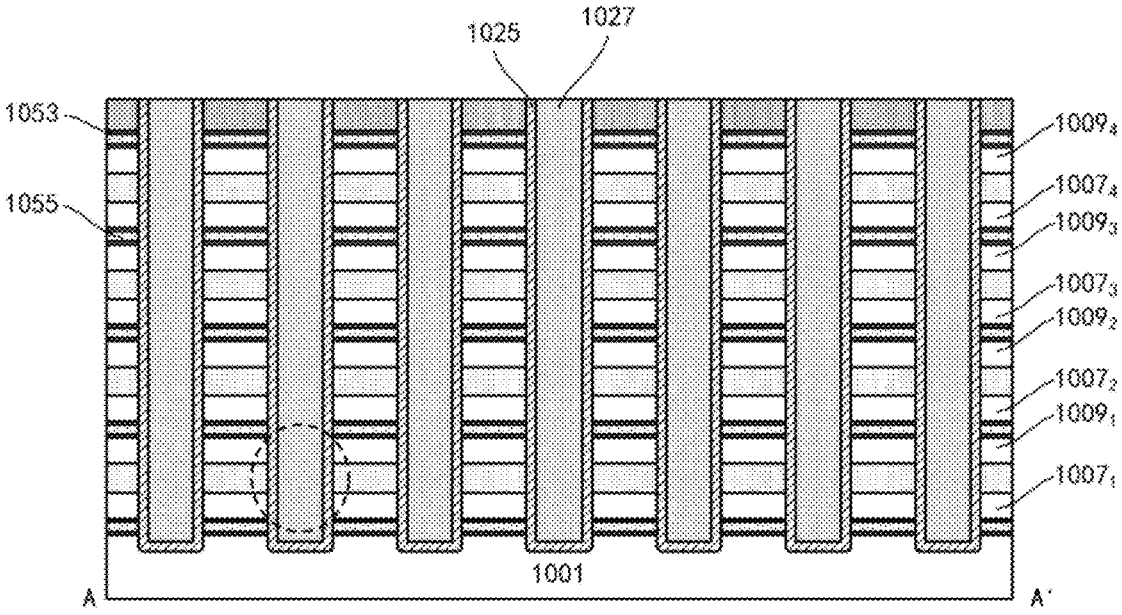

As shown in FIG. 9, a memory functional layer 1025 and a gate conductor layer 1027 may be formed in sequence by, for example, deposition. The memory functional layer 1025 may be formed in a substantially conformal manner, and the gate conductor layer 1027 may be filled in a remaining gap in the processing channel T after forming the memory functional layer 1025 in the processing channel T. A planarization process, such as Chemical Mechanical Polishing (CMP, for example, may stop at the hard mask layer 1015), may be performed on the formed gate conductor layer 1027 and memory functional layer 1025, so that the gate conductor layer 1027 and the memory functional layer 1025 may be left in the processing channel T, so as to form the gate stack.

The memory functional layer 1025 may be based on a dielectric charge trapping, a ferroelectric material effect or a band gap engineering charge storage (SONOS), etc. For example, the memory functional layer 1025 may include a dielectric tunneling layer (e.g., an oxide with a thickness in a range of about 1 nm to 5 nm, which may be formed by oxidation or ALD)—a band offset layer (e.g., a nitride with a thickness in a range of about 2 nm to 10 nm, which may be formed by CVD or ALD)—an isolation layer (e.g., an oxide with a thickness in a range of about 2 nm to 6 nm, which may be formed by oxidation, CVD or ALD). The three-layer structure may lead to an energy band structure that traps electrons or holes. Alternatively, the memory functional layer 1025 may include a ferroelectric material layer, such as $HfZrO_2$ with a thickness in a range of about 2 nm to 20 nm.

For example, the gate conductor layer 1027 may include a (doped, for example, p-type doped in a case of the n-type device) polysilicon or a metal gate material.

As shown in FIG. 9, the gate stack (1025/1027) with the memory functional layer is surrounded by the cell active layer. The gate stack cooperates with the cell active layer to define the memory cell, as shown in a dotted circle in FIG. 9. The channel region may be connected to the source/drain regions on opposite sides, and the channel region may be controlled by the gate stack. One of the source/drain regions at upper and lower ends of a single memory cell is used as the source region and may be electrically connected to the source line; the other of the source/drain regions is used as the drain region and may be electrically connected to the bit line. In a NOR-type memory device, for every two vertically adjacent memory cells, a source/drain region at an upper end of the lower memory cell and a source/drain region at a lower end of the upper memory cell may be used as the source regions, so that the source regions may share a same source line connection.

The gate stack extends in a shape of column in the vertical direction, and overlaps the plurality of cell active layers, so that a plurality of memory cells stacked on each other in the vertical direction may be defined. The memory cells associated with a single gate stack column may form a memory cell string. Corresponding to a layout (corresponding to a layout of the above-mentioned processing channels T, such as a two-dimensional array) of the gate stack columns, a plurality of memory cell strings are provided on the substrate to form a three-dimensional (3D) array of the memory cells.

In this way, a production of the memory cells (in the cell region) may be completed. Then, various electrical contact portions may be produced (in the contact region) to achieve a desired electrical connection.

In order to achieve an electrical connection to each cell active layer, a stepped structure may be formed in the contact region. Various methods are provided in the art to form the stepped structure. According to embodiments of the present disclosure, the stepped structure may be formed as follows, for example.

Figure 10A:
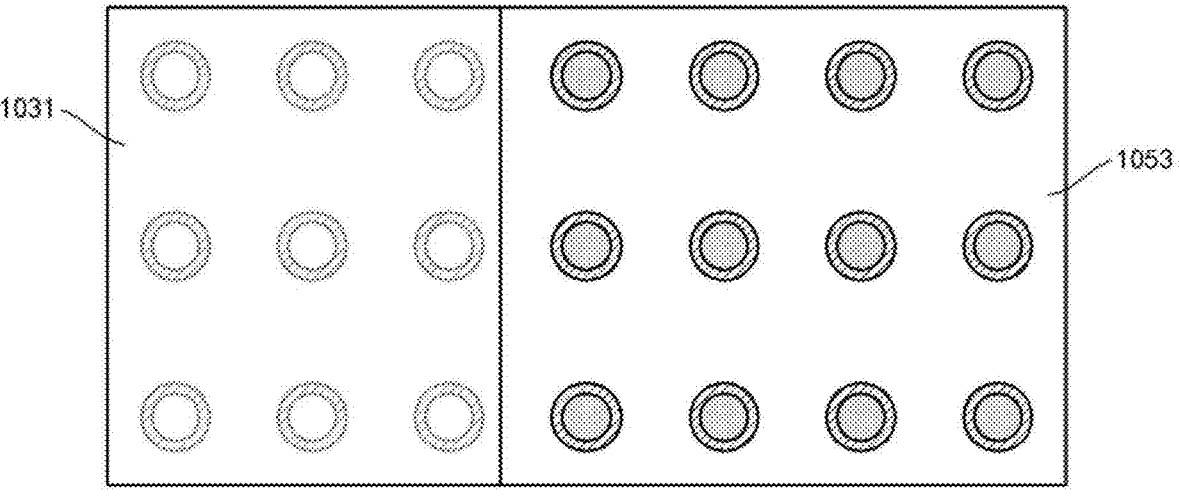
Figure 10B:
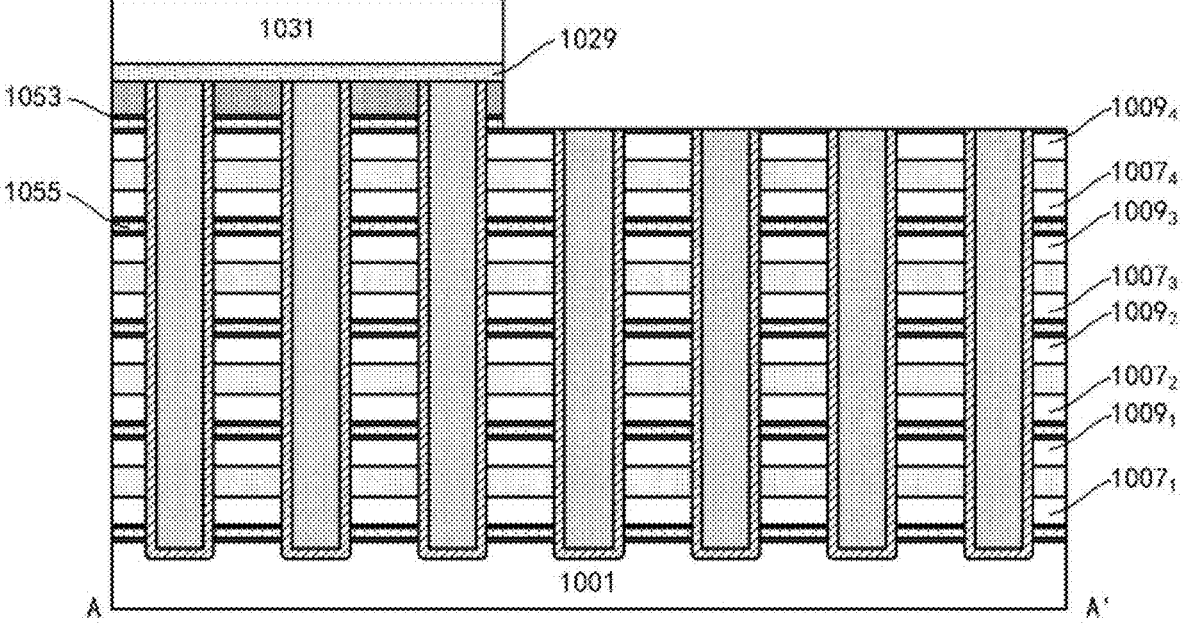
Figure 10C:
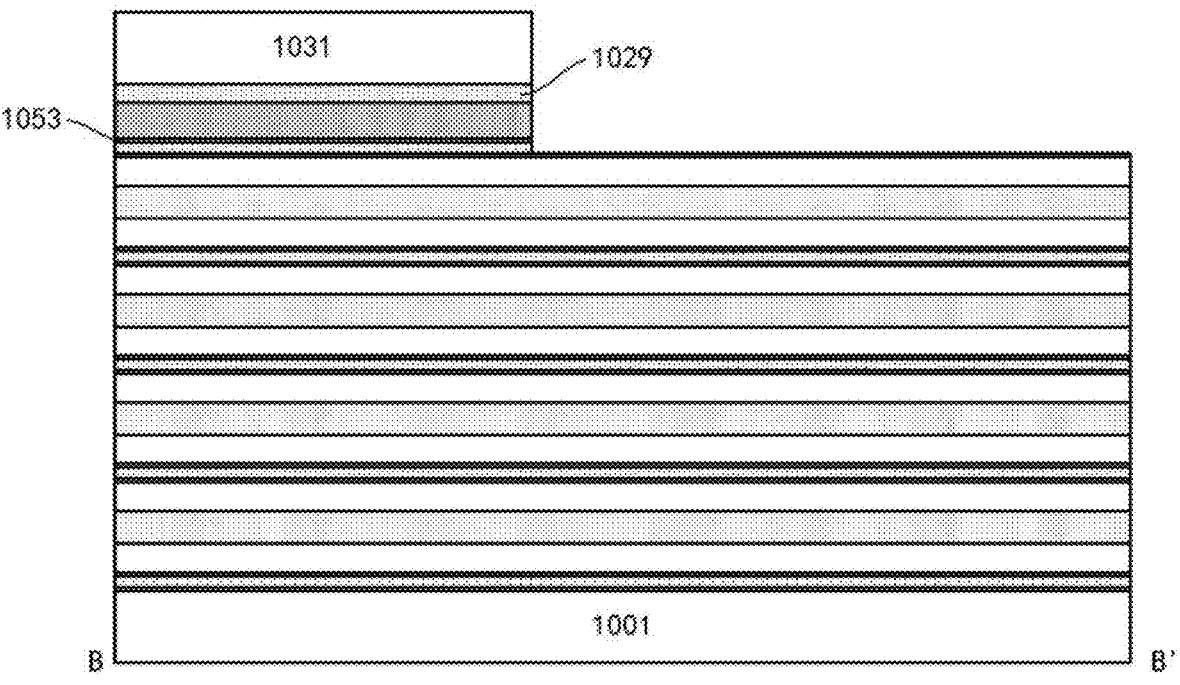

As shown in FIG. 9, the current gate stack is exposed at a surface of the hard mask layer 1015. In order to protect the gate stack (in the cell region) when producing the stepped structure, another hard mask layer 1029 may be formed on the hard mask layer 1015, as shown in FIG. 10(a), FIG. 10(b) and FIG. 10(c). For example, the hard mask layer 1029 may include an oxide. A photoresist 1031 may be formed on the hard mask layer 1029, and the photoresist 1031 may be patterned by photolithography to mask the cell region and expose the contact region. The hard mask layer 1029, the hard mask layer 1015, the conductive metal layer 1053, the insulating layer 1055 and the gate stack may be etched by a selective etching such as RIE by using the photoresist 1031 as an etching mask. The etching depth may be controlled so that a surface exposed by the photoresist 1031 in the contact region after being etched may be substantially flat. For example, the hard mask layer 1029 may be etched; and then, the gate conductor layer 1027 may be etched, and the etching of the gate conductor layer 1027 may stop near a top surface of the cell active layer $1005_4$; next, the hard mask layer 1015, the conductive metal layer 1053 and the insulating layer 1055 may be etched sequentially; after such etchings, a top of the memory functional layer 1025 may protrude above the top surface of the cell active layer $1005_4$ and may be removed by RIE. In this way, a step may be formed between the contact region and the cell region. After that, the photoresist 1031 may be removed.

Figure 11A:
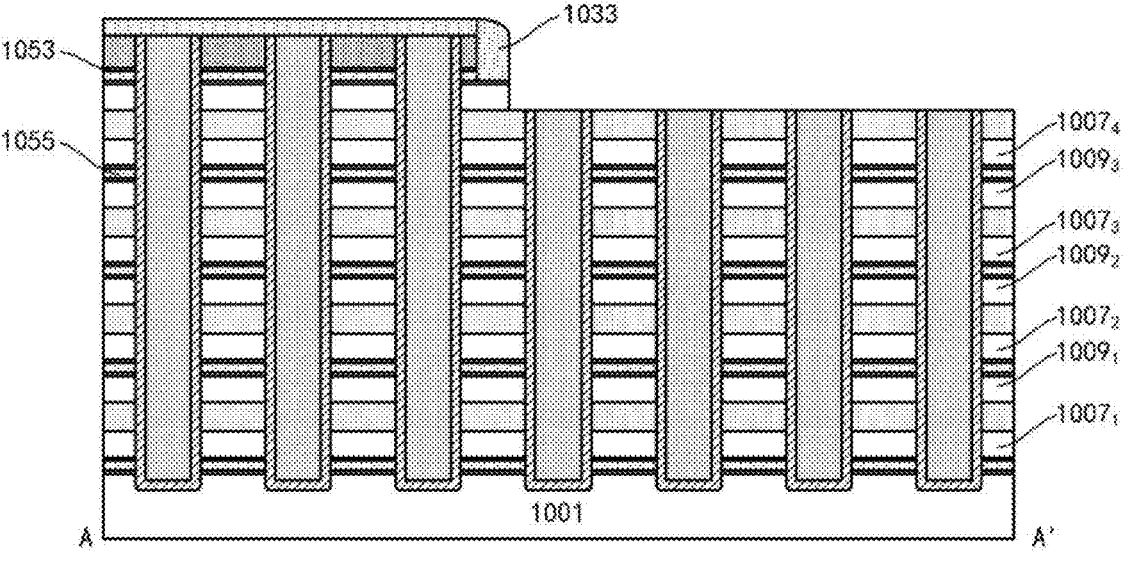
Figure 11B:
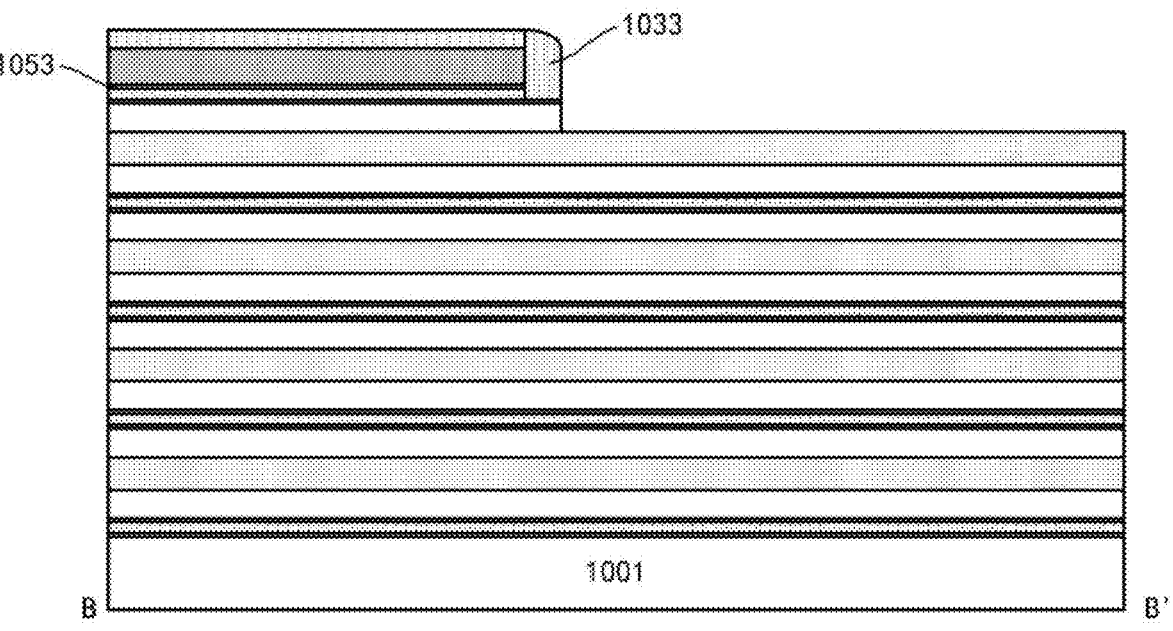

As shown in FIG. 11(a) and FIG. 11(b), a spacer 1033 may be formed at the step between the contact region and the cell region through a spacer forming process. For example, a layer of dielectric such as an oxide may be deposited in a substantially conformal manner, and then an anisotropic etching, such as RIE in the vertical direction, may be performed on the deposited dielectric, so as to remove a lateral extension of the deposited dielectric and leave a vertical extension of the deposited dielectric, so that the spacer 1033 may be formed. Here, in consideration of the hard mask layer 1029 also including an oxide, an etching depth of the RIE may be controlled to be substantially equal to or slightly greater than a deposition thickness of a dielectric, so as to avoid completely removing the hard mask layer 1029. A width of the spacer 1033 (in a horizontal direction in the drawings) may be substantially equal to the deposition thickness of the dielectric. The width of the spacer 1033 defines a size of a landing pad subsequently to a contact portion of the source/drain region $1009_4$ in the cell active layer $1005_4$.

The conductive metal layer 1053, the source/drain region $1009_4$ in the cell active layer $1005_4$ and the gate stack may be etched by a selective etching such as RIE by using the spacer 1033 thus formed as an etching mask, so as to expose a channel region in the cell active layer $1005_4$. A surface exposed by the spacer 1033 in the contact region after being etched may be substantially flat by controlling the etching depth. For example, the conductive metal layer 1053 may be etched to expose the source/drain region $1009_4$, and then the source/drain region $1009_4$ and the gate conductor layer 1027 (for example, Si and polycrystalline Si respectively; if the gate conductor layer 1027 includes a metal gate, the source/drain region $1009_4$ and the gate conductor layer 1027 may be etched respectively) may be etched, and the etching may stop at the channel region in the cell active layer $1005_4$; after such etchings, the top of the memory functional layer 1025 may protrude above the channel region in the cell active layer $1005_4$ and may be removed by ME. In this way, in the contact region, another step may be formed between the source/drain region $1009_4$ in the cell active layer $1005_4$ and the surface exposed by the spacer 1033.

Figure 12A:
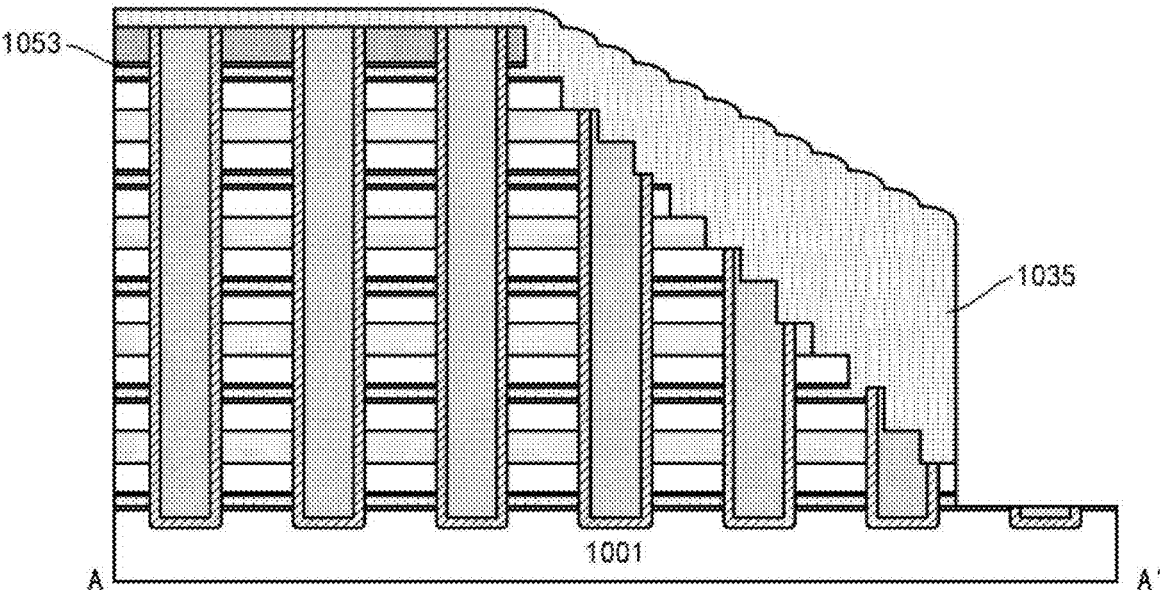
Figure 12B:
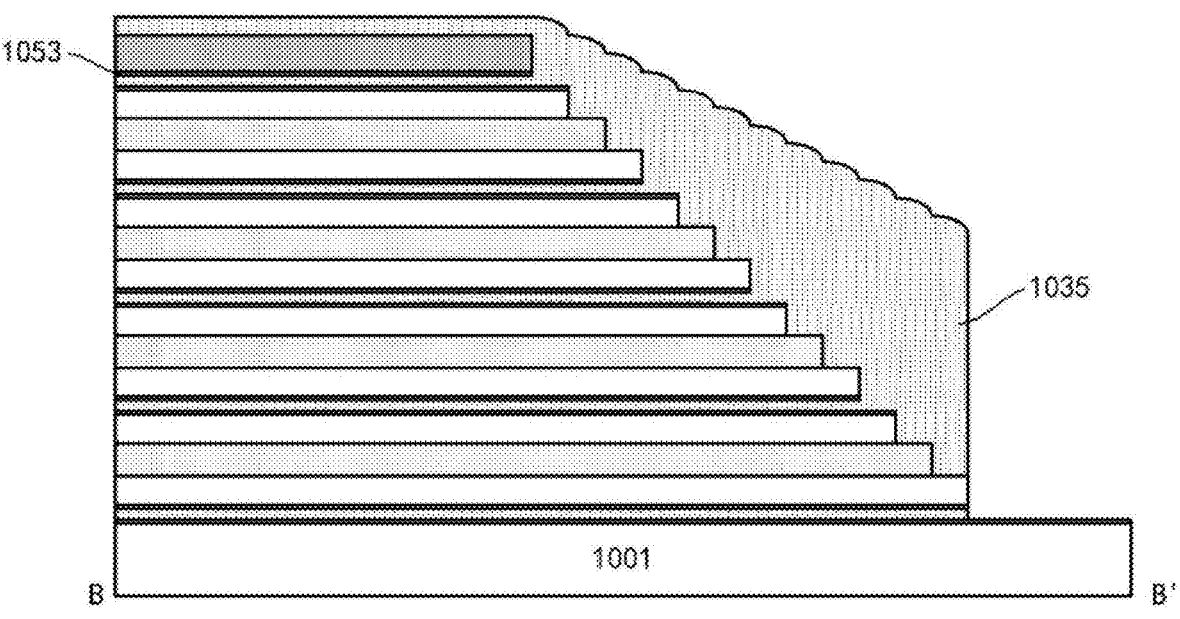

According to the process described above in combination with FIG. 11(a) and FIG. 11(b), a plurality of steps may be formed in the contact region by forming the spacer and etching with the spacer as an etching mask, as shown in FIG. 12(a) and FIG. 12(b). The steps form the stepped structure, so that each source/drain region (a conductive metal layer on a surface is also patterned with the corresponding source/drain region) and/or the channel region that require/requires an electrical connection in each cell active layer have an end portion protruding relative to a region above, so as to define a landing pad to the contact portion in the region. The 1035 shown in FIG. 12(a) and FIG. 12(b) represents a remaining portion of the spacers formed various times after processing. As the spacer 1035 and the isolation layer are oxides, the spacer 1035 and the isolation layer may be shown here as a whole.

After that, the contact portion may be produced.

Figure 13A:
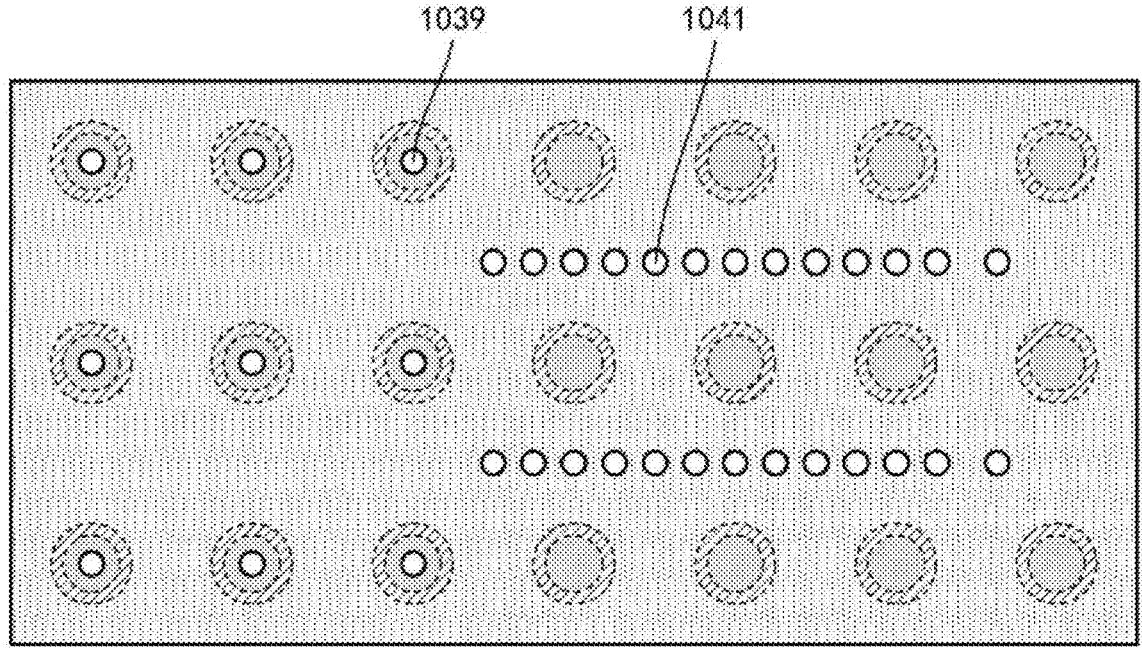
Figure 13B:
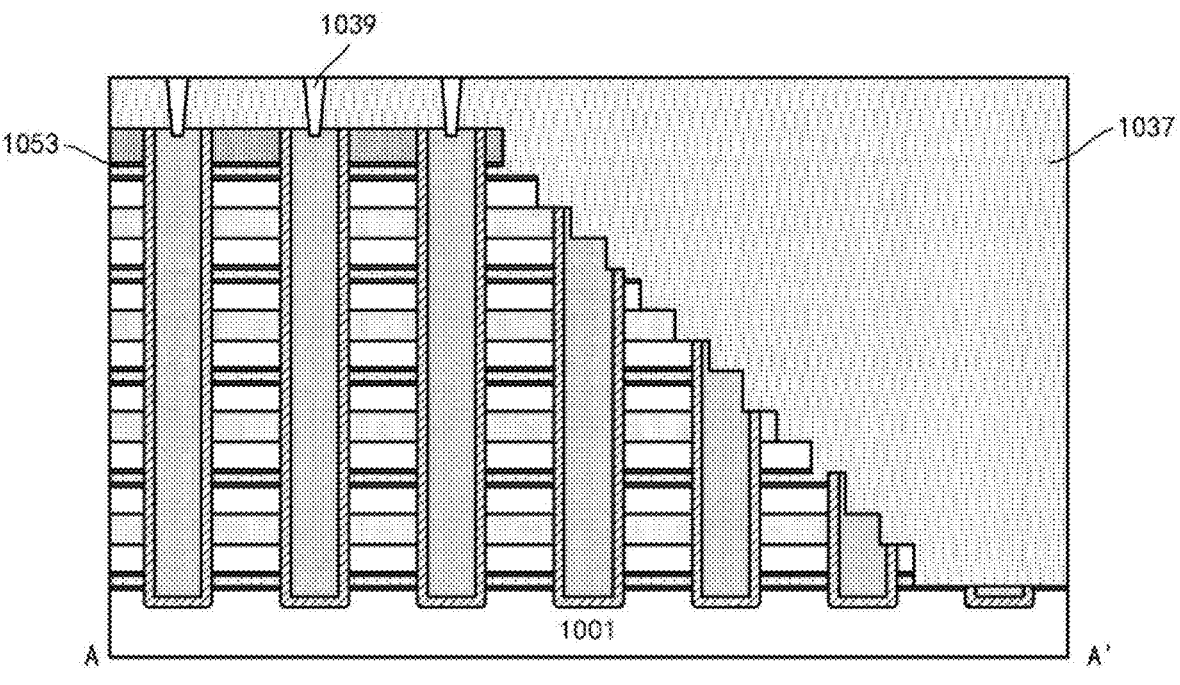
Figure 13C:
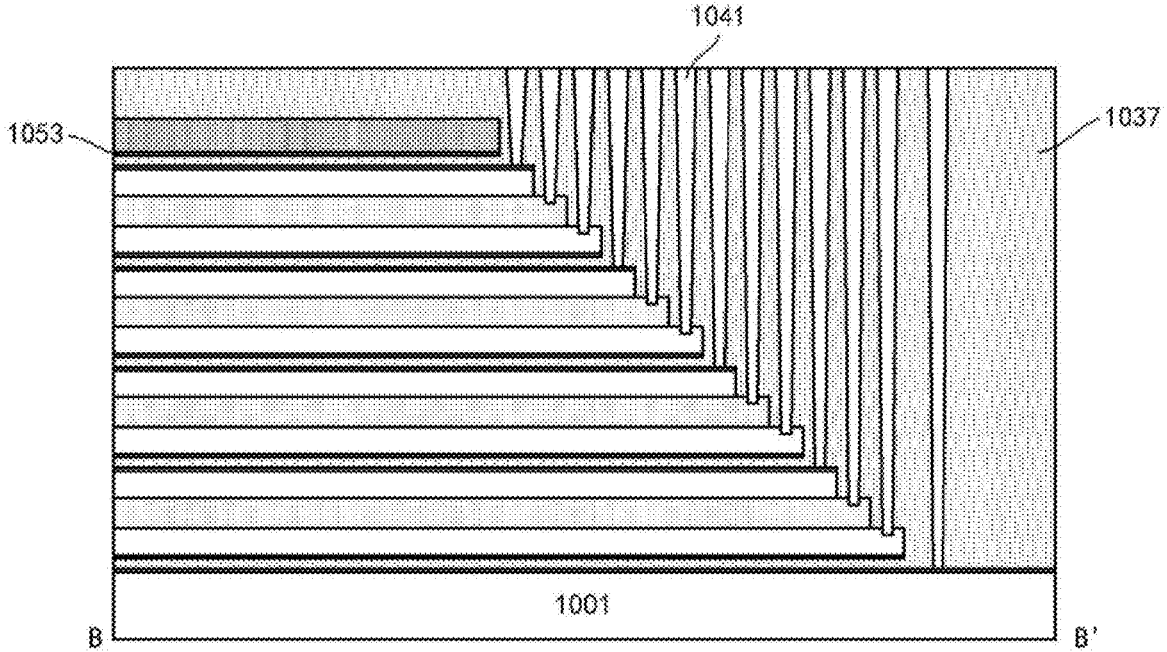

For example, as shown in FIG. 13(a), FIG. 13(b) and FIG. 13(c), an interlayer dielectric layer 1037 may be formed by depositing an oxide and performing a planarization process such as CMP. Here, as the isolation layer and the spacer 1035 as described above are both oxides, the isolation layer and the spacer 1035 as described above are shown as being integrated with the interlayer dielectric layer 1037. Then, as shown in the drawings, contact portions 1039 and 1041 may be formed in the interlayer dielectric layer 1037. Specifically, the contact portion 1039 is formed in the cell region and is electrically connected to the gate conductor layer 1027 in the gate stack; the contact portion 1041 is formed in the contact region and is electrically connected to each source/drain region and/or the channel region. The contact portion 1041 in the contact region may avoid a residual gate stack in the contact region. The contact portion may be formed by etching a hole in the interlayer dielectric layer 1037 and filling the hole with a conductive material such as a metal.

The contact portion 1039 may be electrically connected to a word line. Through the word line, a gate control signal may be applied to the gate conductor layer 1027 via the contact portion 1039. The contact portion 1041 may be electrically connected to a source line or a bit line. More specifically, one source/drain region of a same memory cell may be electrically connected to the bite line, and the other source/drain region of the same memory cell may be electrically connected to the source line. Due to an existence of the conductive metal layer 1053, a resistance when electrical signals from the bit line and the source line are applied to corresponding source/drain regions may be reduced. Here, a contact portion to the channel region is also formed. The contact portion may be referred to as a body contact portion and may receive a body bias to adjust a device threshold voltage.

Figure 14:
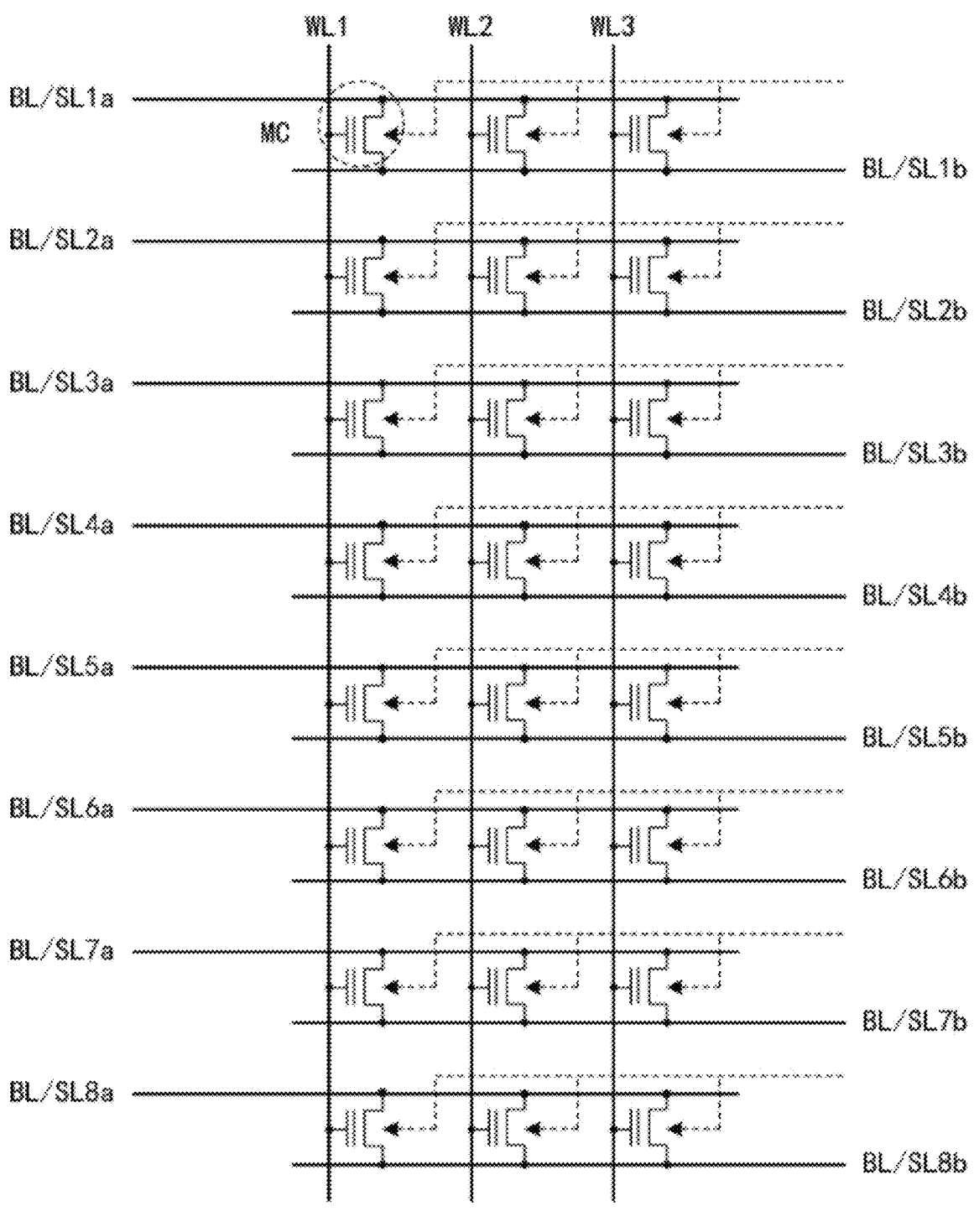
FIG. 14 schematically shows an equivalent circuit diagram of a memory device according to an embodiment of the present disclosure.

FIG. 14 schematically shows an equivalent circuit diagram of a memory device according to an embodiment of the present disclosure.

In the example of FIG. 14, eight memory cell layers stacked on each other (corresponding to eight cell active layers in the above-mentioned embodiments) and three word lines WL1, WL2, and WL3 passing through the eight memory cell layers are shown. The memory cells in each memory cell layer may be connected in parallel between corresponding bit line and source line. FIG. 14 schematically shows bit lines/source lines BL/SL1a, BL/SL1b, BL/SL2a, BL/SL2b, BL/SL3a, BL/SL3b, BL/SL4a, BL/SL4b, BL/SL5a, BL/SL5b, BL/SL6a, BL/SL6b, BL/SL7a, BL/SL7b, BL/SL8a and BL/SL8b for the eight memory cell layers. One line (e.g., BL/SLia) in each pair of bit line and source line BL/SLia and BL/SLib (where $1 \leq i \leq 8$) may be used as the bit line, and the other line (e.g., BL/SLib) in that pair of bit line and source line BL/SLia and BL/SLib may be used as the source line. It should be noted that, the number of memory cell layers, the number of bit lines/source lines, and the number of word lines are not limited to this. A memory cell MC is provided at an intersection of the bit line and the word line. In addition, FIG. 14 schematically shows an optional body connection to each memory cell with a dotted line.

Here, for the convenience of illustration, a two-dimensional array of the memory cells MCs is shown. A plurality of two-dimensional arrays may be provided in a direction intersecting the two-dimensional array (e.g., a direction perpendicular to a paper surface in the drawings) to obtain a three-dimensional array.

Based on such configuration, a NOR-type or AND-type flash memory may be formed. As described in further detail below, for the NOR-type flash memory, the source lines of at least two memory cell layers may be connected to each other.

In the above-mentioned embodiments, conductive metal layers may be formed on the upper and lower surfaces of each cell active layer, and may be used as the bit line connection and the source line connection so as to reduce a resistance. However, embodiments of the present disclosure are not limited to this. For example, the conductive metal layer may be formed only on the upper surface or the lower surface of each cell active layer.

FIG. 15 to FIG. 18 show schematic diagrams of some stages in a process of manufacturing a memory device according to another embodiment of the present disclosure.

Figure 15:
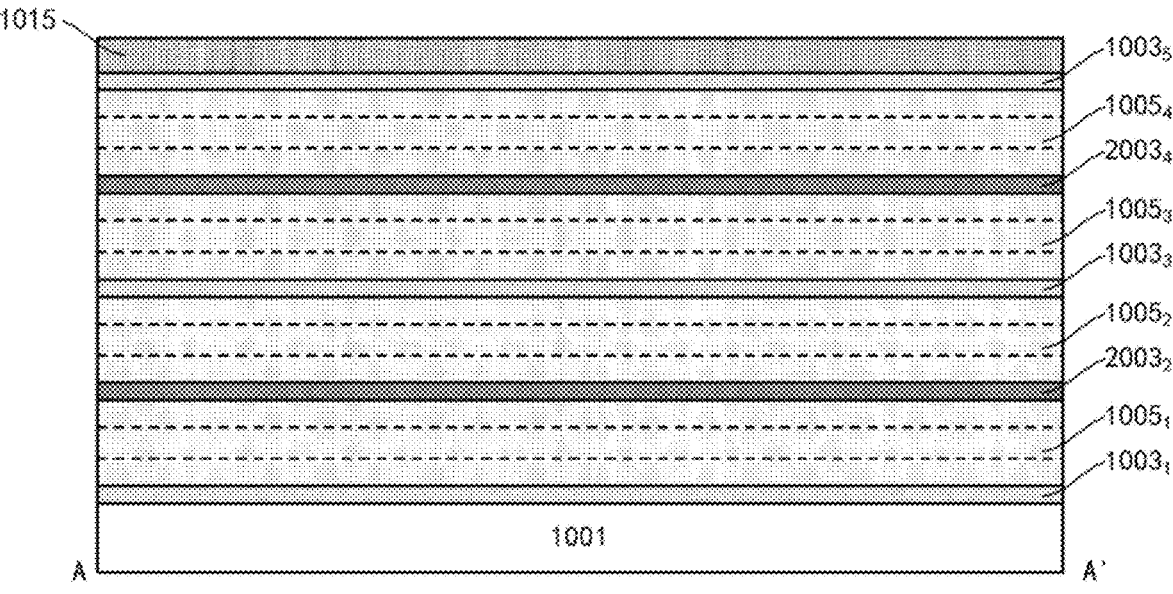
FIG. 15 to FIG. 18 show schematic diagrams of some stages in a process of manufacturing a memory device according to another embodiment of the present disclosure.

As shown in FIG. 15, a stack of sacrificial layers and cell active layers may be formed on the substrate 1001 as described above in combination with FIG. 1. Here, the sacrificial layers may include the first sacrificial layers 1003$_1$, 1003$_3$ and 1003$_5$ and second sacrificial layers 2003$_2$ and 2003$_4$ that have an etching selectivity relative to each other, so that one of the first sacrificial layer and the second sacrificial layer may be formed on an upper surface of each of the cell active layers 1005$_1$, 1005$_2$, 1005$_3$, 1005$_4$ and 1005$_5$, and the other of the first sacrificial layer and the second sacrificial layer may be formed on a lower surface of each of the cell active layers 1005$_1$, 1005$_2$, 1005$_3$, 1005$_4$ and 1005$_5$. For example, the first sacrificial layer and the second sacrificial layer may include SiGe with different atomic percentages of Ge, or one of the first sacrificial layer and the second sacrificial layer may include SiGe and the other may include SiC. In addition, the cell active layers 1005$_1$, 1005$_2$, 1005$_3$, 1005$_4$ and 1005$_5$ may be doped in situ during an epitaxial growth, so as to define the source/drain regions. FIG. 15 schematically shows a doping concentration interface between the source/drain region and the channel region with a dotted line (in the following drawings, the dotted line is not shown for the sake of convenience).

Figure 16:
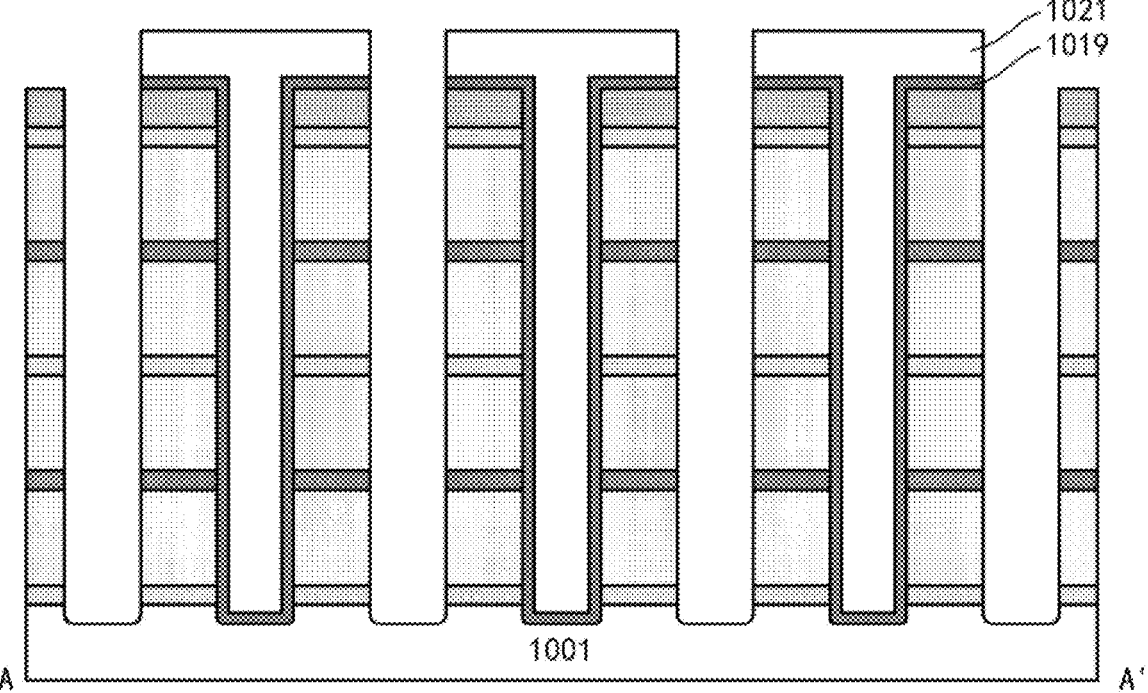

Next, as described above, processing channels may be formed in the stack, and a supporting layer 1019 may be formed in at least one processing channel, so as to obtain the structure shown in FIG. 16. Similarly, through the processing channel, the sacrificial layer may be replaced with a structure in which the isolation layer is between the conductive metal layers. However, different from the above-mentioned embodiments, the first sacrificial layer 1003$_1$/1003$_3$/1003$_5$ and the second sacrificial layer 2003$_2$/2003$_4$ may be replaced separately.

Figure 17:
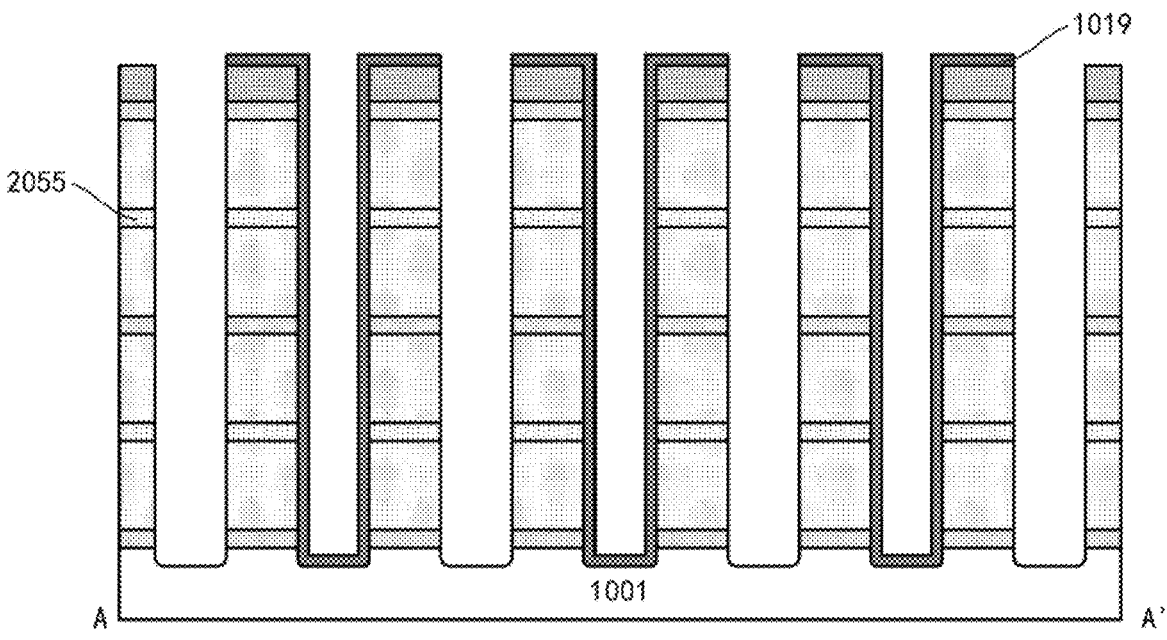

For example, as shown in FIG. 17, the second sacrificial layers 2003$_2$ and 2003$_4$ may be removed by a selective etching (especially relative to the first sacrificial layers 1003$_1$, 1003$_3$ and 1003$_5$), and in a space released due to a removal of the second sacrificial layers 2003$_2$ and 2003$_4$, an isolation layer 2055 may be formed by depositing and then etching back a dielectric (e.g., an oxide).

Figure 18:
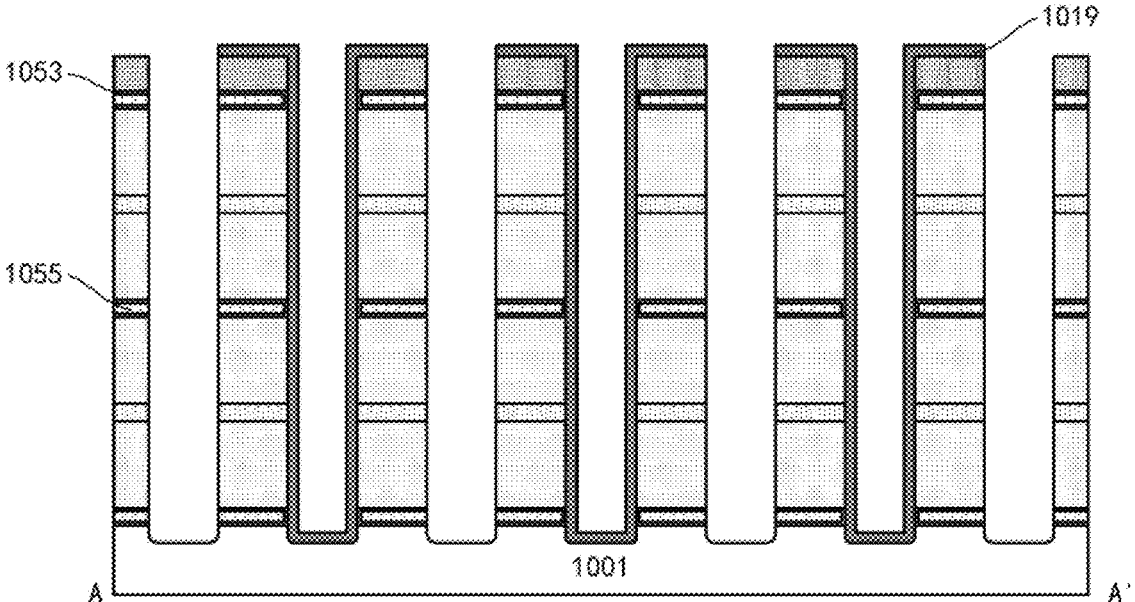

Then, as shown in FIG. 18, the first sacrificial layers 1003$_1$, 1003$_3$ and 1003$_5$ may be removed by the selective etching, and in a space released due to a removal of the first sacrificial layers 1003$_1$, 1003$_3$ and 1003$_5$, the conductive metal layer 1053 and the isolation layer 1055 may be formed as described above in combination with FIG. 7. Therefore, the conductive metal layer 1053 may be formed only on either an upper surface or a lower surface of each of the cell active layers 1005$_1$, 1005$_2$, 1005$_3$, 1005$_4$ and 1005$_5$, and on the other surface, the isolation layer 2055 may be formed and no conductive metal layer may be formed.

Subsequent processes may be performed according to the above-mentioned embodiments, such as a removal of the supporting layer, an etching of the sidewall portion of the conductive metal layer 1053, a formation of the gate stack in the processing channel, etc.

According to other embodiments, only one of the first sacrificial layer and the second sacrificial layer may be removed to form the conductive metal layers (between which the isolation layer is), and the other may be retained. For example, one of the first sacrificial layer and the second sacrificial layer may include SiGe, and the other may include Si or a Si layer with a p-n-p doping distribution or n-p-n doping distribution in the vertical direction (the Si layer may form an electrical isolation through a pn junction).

In the above-mentioned embodiments, an isolation layer may be provided between adjacent cell active layers. However, the present disclosure is not limited to this. According to other embodiments, some cell active layers may not be isolated from each other.

Figure 19:
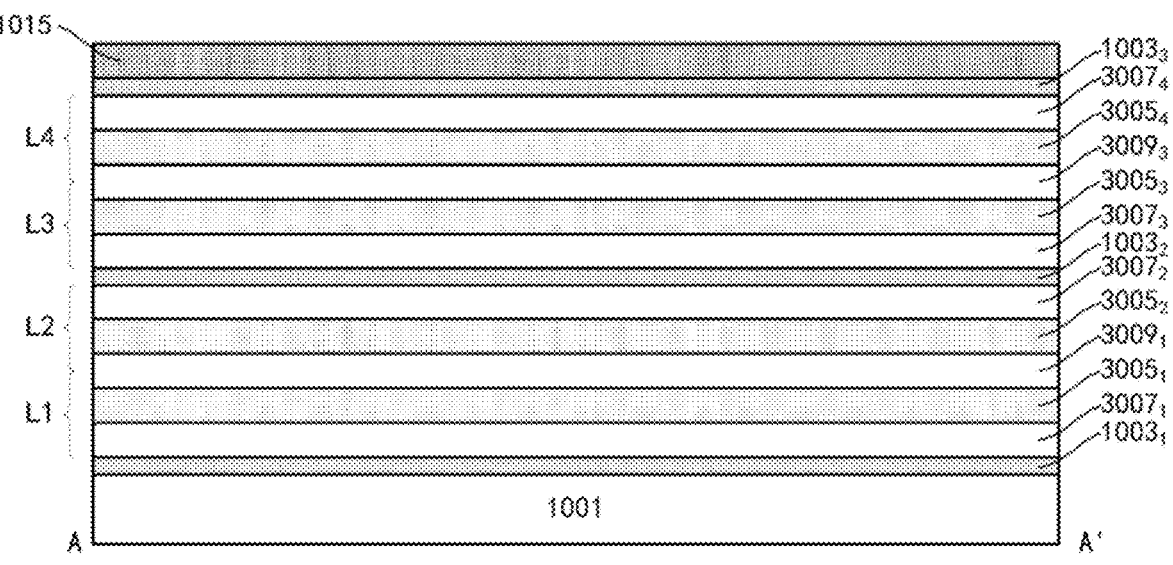
FIG. 19 to FIG. 21 show schematic diagrams of some stages in a process of manufacturing a memory device according to another embodiment of the present disclosure.
Figure 20:
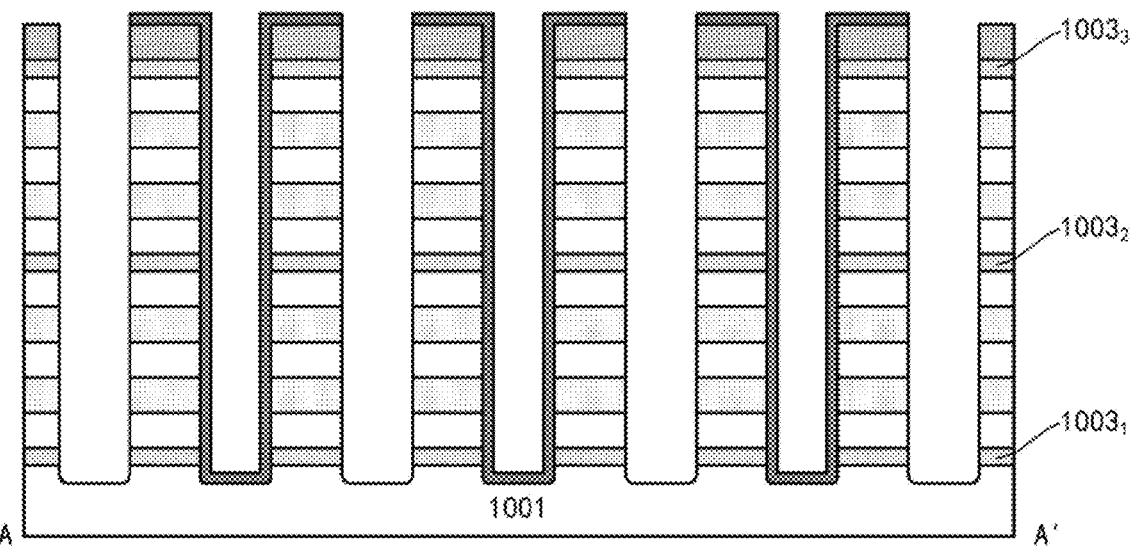
Figure 21:
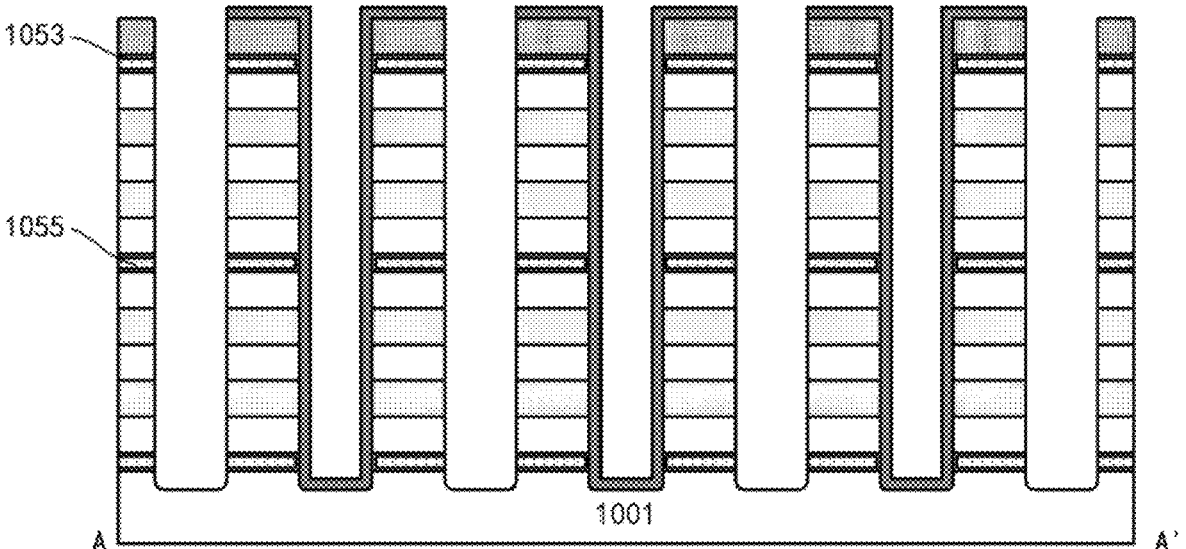

FIG. 19 to FIG. 21 show schematic diagrams of some stages in a process of manufacturing a memory device according to another embodiment of the present disclosure.

As shown in FIG. 19, a stack of cell active layers and sacrificial layers may be formed on the substrate 1001. Different from the embodiments described above in combination with FIG. 1 in which the sacrificial layer is provided between two adjacent cell active layers, in this embodiment, the sacrificial layer may be provided at an interval of every two adjacent cell active layers, that is, no sacrificial layer is provided between cell active layers L1 and L2, and the sacrificial layers $1003_1$ and $1003_2$ are provided on lower and upper sides of a combination of the cell active layers L1 and L2, respectively; no sacrificial layer is provided between cell active layers L3 and L4, and the sacrificial layers $1003_2$ and $1003_3$ are provided on lower and upper sides of a combination of the cell active layers L3 and L4, respectively.

Each cell active layer may define the source/drain regions (and therefore the channel region therebetween) by in situ doping. For example, the cell active layer L1 may include a first source/drain region $3007_1$, a channel region $3005_1$ and a second source/drain region $3009_1$, which may be formed by introducing different concentrations of impurities at different stages of epitaxial growth. The cell active layer L2 may include a first source/drain region $3007_2$, a channel region $3005_2$ and the second source/drain region $3009_1$. Here, the cell active layer L1 and the cell active layer L2 adjoin each other and may share the same source/drain region $3009_1$. Similarly, the cell active layer L3 may include a first source/drain region $3007_3$, a channel region $3005_3$ and a second source/drain region $3009_3$. The cell active layer L4 may include a first source/drain region $3007_4$, a channel region $3005_4$ and the second source/drain region $3009_3$. The cell active layer L3 and the cell active layer L4 may share the same source/drain region $3009_3$.

Next, as described above, processing channels may be formed in the stack, and a supporting layer 1019 may be formed in at least one processing channel, so as to obtain the structure shown in FIG. 20. Similarly, through the processing channel, the sacrificial layer may be replaced with the structure in which the isolation layer is between the conductive metal layers.

Then, as shown in FIG. 21, the first sacrificial layers $1003_1$, $1003_2$ and $1003_3$ may be removed by the selective etching. In a space released due to a removal of the first sacrificial layers $1003_1$, $1003_2$ and $1003_3$, the conductive metal layer 1053 and the isolation layer 1055 may be formed as described above in combination with FIG. 7. Therefore, the conductive metal layer 1053 may be formed only at an upper end or a lower end of each of the cell active layers L1, L2, L3, L4, and the other end may adjoin the adjacent cell active layer.

Subsequent processes may be performed according to the above-mentioned embodiments, such as a removal of the supporting layer, an etching of the sidewall portion of the conductive metal layer 1053, and a formation of the gate stack in the processing channel.

In the embodiments, two memory cells adjacent to each other in the vertical direction may share a same source/drain region and may be electrically connected to the source line together. A NOR-type configuration may thus be obtained.

Figure 22:
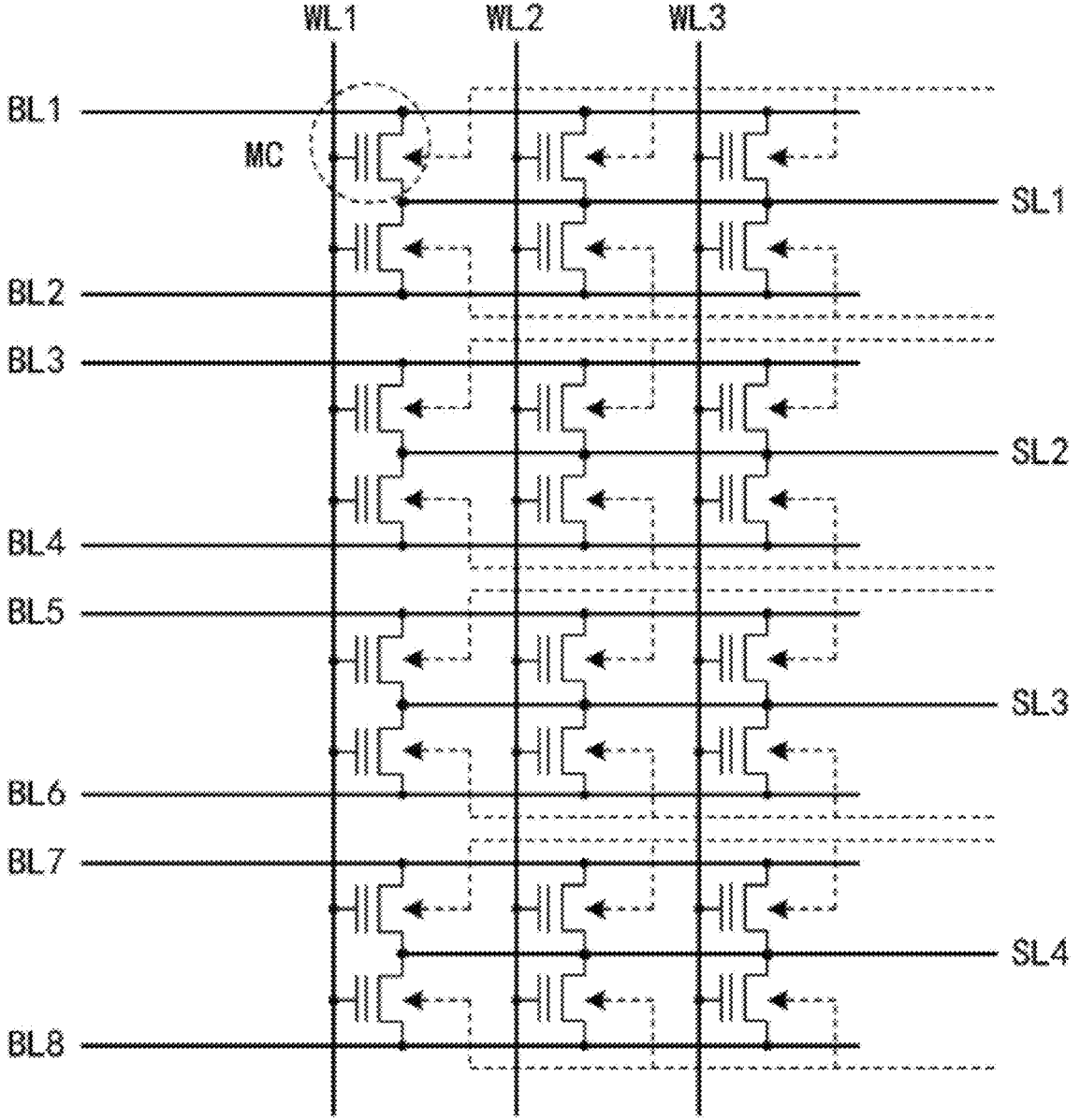
FIG. 22 schematically shows an equivalent circuit diagram of a NOR type memory device according to an embodiment of the present disclosure, and where

FIG. 22 schematically shows an equivalent circuit diagram of a NOR type memory device according to an embodiment of the present disclosure.

In the example of FIG. 22, three word lines WL1, WL2, WL3 and eight bit lines BL1, BL2, BL3, BL4, BL5, BL6, BL7 and BL8 are schematically shown. However, the specific number of bit lines and the specific number of word lines are not limited to this. A memory cell MC is provided at an intersection of the bit line and the word line. FIG. 22 further shows four source lines SL1, SL2, SL3 and SL4. As described above, every two adjacent memory cell layers in the vertical direction may share a same source line connection. In addition, the source lines may be connected to each other, so that each memory cell MC may be connected to a common source line. In addition, FIG. 22 further schematically shows an optional body connection to each memory cell with a dotted line. As described below, the body connection of each memory cell may be electrically connected to the source line connection of the memory cell.

An extension direction of the word lines WL1 to WL3 shown in FIG. 22 may correspond to an extension direction of the gate stack, that is, the vertical direction relative to the substrate in the above-mentioned embodiments. Adjacent bit lines in the direction are isolated from each other.

For every two adjacent memory cells in the vertical direction, the source/drain region in the middle, that is, the source/drain region $3009_1$ in the middle of the combination of the cell active layer L1 and the cell active layer L2, the source/drain region $3009_3$ in the middle of the combination of the cell active layer L3 and the cell active layer L4, may be electrically connected to the source line through the contact portion (referring to 1041 shown in FIG. 13(c)); the source/drain regions at the upper and lower ends, that is, the source/drain region $3007_1$ in the cell active layer L1 and the source/drain region $3007_2$ in the cell active layer L2, the source/drain region $3007_3$ in the cell active layer L3 and the source/drain region $3007_4$ in the cell active layer L4, may be electrically connected to the bit lines through the contact portions (referring to 1041 in FIG. 13(c)), respectively.

Here, the source/drain region in the middle of two adjacent memory cells in the vertical direction is electrically connected to the source line, which may reduce the amount of wiring.

The memory device according to embodiments of the present disclosure may be applied to various electronic apparatuses. For example, the memory device may store various programs, applications and data required for an operation of the electronic apparatus. The electronic apparatus may further include a processor matched with the memory device. For example, the processor may operate the electronic apparatus by running a program stored in the memory device. The electronic apparatus may include, for example, a smart phone, a Personal Computer (PC), a tablet computer, an artificial intelligence apparatus, a wearable apparatus, a mobile power supply, an automotive electronic apparatus, a communication apparatus or an Internet of Things (IoT) apparatus, etc.

In the above-mentioned descriptions, technical details such as patterning and etching of each layer have not been described in detail. However, those skilled in the art should understand layers, regions, etc. of a desired shape may be formed by various technical means. In addition, in order to form the same structure, those skilled in the art may further design a method that is not exactly the same as the method described above. In addition, although the various embodiments have been described above respectively, this does not mean that the measures in the various embodiments may not be advantageously used in combination.

Embodiments of the present disclosure have been described above. However, the embodiments are for illustrative purposes only, and are not used to define the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A memory device, comprising:
   a plurality of cell active layers vertically stacked on a substrate, wherein each cell active layer comprises a lower source/drain region and an upper source/drain region located at different vertical heights in the cell active layer, and a channel region between the lower source/drain region and the upper source/drain region;

a gate stack on the substrate and extending vertically relative to the substrate to pass through the plurality of cell active layers, wherein the gate stack comprises a gate conductor layer and a memory functional layer arranged between the gate conductor layer and the cell active layers, and a memory cell is defined at an intersection of the gate stack and each cell active layer; and a conductive metal layer arranged on at least one of a lower surface of each cell active layer and an upper surface of each cell active layer, wherein the memory device further comprises:

an isolation layer between adjacent conductive metal layers in a vertical direction, and a top isolation layer on the plurality of cell active layers, wherein the top isolation layer comprises a first surface facing a topmost cell active layer among the plurality of cell active layers and a second surface away from the topmost cell active layer, the conductive metal layer is arranged on both the first surface and the second surface of the top isolation layer, and the conductive metal layer arranged on the first surface of the top isolation layer is the conductive metal layer arranged on an upper surface of the topmost cell active layer.

2. The memory device according to claim 1, wherein each of the lower surface of the cell active layer and the upper surface of the cell active layer is provided with the conductive metal layer.

3. The memory device according to claim 1, wherein a cell active layer among the plurality of cell active layers is provided with a conductive metal layer on a lower surface of the cell active layer, and an another cell active layer adjacent to the cell active layer among the plurality of cell active layers is provided with a conductive metal layer on an upper surface of the another cell active layer, or wherein a cell active layer among the plurality of cell active layers is provided with a conductive metal layer on an upper surface of the cell active layer, and an another cell active layer adjacent to the cell active layer among the plurality of cell active layers is provided with a conductive metal layer on a lower surface of the another cell active layer.

4. The memory device according to claim 3, wherein a pair of adjacent cell active layers adjoin each other, and each of a lower surface of a lower cell active layer in the pair of cell active layers and an upper surface of an upper cell active layer in the pair of cell active layers is provided with the conductive metal layer.

5. The memory device according to claim 1, wherein the cell active layer comprises a single crystal semiconductor.

6. The memory device according to claim 1, wherein each cell active layer extends in a lateral direction relative to the substrate, so as to surround a periphery of the gate stack.

7. The memory device according to claim 6, wherein a plurality of gate stacks is provided, the plurality of gate stacks is arranged in an array on the substrate, and each conductive metal layer extends on an upper surface or a lower surface of a corresponding cell active layer so as to surround the periphery of the gate stacks.

8. The memory device according to claim 6, wherein the substrate comprises a cell region and a contact region adjacent to the cell region, and the gate stack is arranged in the cell region, the memory device further comprises:

a first contact portion and a second contact portion formed in the contact region, and respectively to the lower source/drain region and the upper source/drain region of each cell active layer.

9. The memory device according to claim 1, wherein the conductive metal layer is used as a bit line connection or a source line connection.

10. The memory device according to claim 2, wherein the conductive metal layer arranged on one of the lower surface of the cell active layer and the upper surface of the cell active layer is used as a bit line connection, and the conductive metal layer arranged on the other of the lower surface of the cell active layer and the upper surface of the cell active layer is used as a source line connection.

11. The memory device according to claim 4, wherein the conductive metal layer is used as a bit line connection.

12. The memory device according to claim 1, wherein a doping concentration in the lower source/drain region and the upper source/drain region decreases towards the channel region in a vertical direction.

13. The memory device according to claim 1, further comprising:

an interface layer between the lower source/drain region and the channel region, and an interface layer between the upper source/drain region and the channel region.

14. The memory device according to claim 1, wherein a maximum doping concentration in the lower source/drain region and the upper source/drain region is greater than $1E20\ cm^{-3}$.

15. The memory device according to claim 1, wherein the memory functional layer comprises at least one of a charge trapping material or a ferroelectric material.

16. An electronic apparatus, comprising the memory device according to claim 1.

17. The electronic apparatus according to claim 16, wherein the electronic apparatus comprises a smart phone, a personal computer, a tablet computer, an artificial intelligence apparatus, a wearable apparatus, a mobile power supply, an automotive electronic apparatus, a communication apparatus or an Internet of things apparatus.

* * * * *